(12) United States Patent
Saebi

(10) Patent No.: US 7,877,237 B1
(45) Date of Patent: *Jan. 25, 2011

(54) METHOD OF PERFORMING A FINITE ELEMENT ANALYSIS OF A COMPOSITE STRUCTURE

(76) Inventor: Nasser Saebi, 18231 N. 66th La., Glendale, AZ (US) 85308

( * ) Notice: Subject to any disclaimer, the term of this patent is extended or adjusted under 35 U.S.C. 154(b) by 574 days.

This patent is subject to a terminal disclaimer.

(21) Appl. No.: 11/973,023

(22) Filed: Oct. 5, 2007

Related U.S. Application Data

(60) Provisional application No. 60/849,635, filed on Oct. 5, 2006.

(51) Int. Cl.
*G06F 17/50* (2006.01)

(52) U.S. Cl. ......................................................... 703/1
(58) Field of Classification Search ........................ 703/1
See application file for complete search history.

(56) References Cited

U.S. PATENT DOCUMENTS

| | | | |
|---|---|---|---|
| 6,205,728 B1 * | 3/2001 | Sutelan ...................... 52/309.7 |
| 6,721,684 B1 * | 4/2004 | Saebi .......................... 702/183 |
| 6,985,832 B2 * | 1/2006 | Saebi .......................... 702/189 |
| 7,107,193 B1 * | 9/2006 | Hummel et al. ................. 703/2 |
| 7,561,995 B2 * | 7/2009 | Willis et al. ..................... 703/6 |
| 2002/0133319 A1 * | 9/2002 | Tang .............................. 703/1 |
| 2003/0154451 A1 * | 8/2003 | Rassaian ........................ 716/4 |
| 2004/0122630 A1 * | 6/2004 | Fife ............................... 703/2 |
| 2004/0204903 A1 * | 10/2004 | Saebi .......................... 702/167 |
| 2005/0022152 A1 * | 1/2005 | Turk et al. ................... 717/100 |

\* cited by examiner

*Primary Examiner*—Paul L Rodriguez
*Assistant Examiner*—Aniss Chad
(74) *Attorney, Agent, or Firm*—Albert W Davis, Jr.

(57) ABSTRACT

The invention provides a method of analyzing a building made from a core of foam plastic which is coated on the inside and outside with a strengthening coating. The building is designed in a CAD program. Then, the building surfaces are meshed in an automeshing program as one piece. Plates are added to the inner, outer and edge surfaces of the core by using copying at zero distance. The core is Solid Meshed. The boundary conditions are chosen for the boundary nodes. Appropriate characteristics of the EPS and GFRC have been assigned to the core and plates. A FEA analysis can be run.

4 Claims, 40 Drawing Sheets

METHOD OF PERFORMING A FINITE ELEMENT ANALYSIS OF A COMPOSITE STRUCTURE

This application is a continuation-in-part of Ser. No. 60/849,635, filed Oct. 5, 2006.

This application is related to U.S. Pat. No. 6,721,684, granted to the inventor, in which the core of the composite building was created by using the manual method of dividing the solid core geometry of the CAD model into bricks and tetrahedral elements (FIGS. 67 through 87 of that patent).

This application is also related to the nonprovisional patent application claiming priority from provisional patent application Ser. No. 60/848,554, filed Sep. 20, 2006 which is incorporated by reference.

BACKGROUND OF THE INVENTION

This invention discloses an improvement on U.S. Pat. No. 6,721,684 which disclosed a method of performing the Finite Element Analysis (FEA) of a composite structure using a FEA program, such as Algor FEMPRO. Now, in these programs, the solid, shell, or plate structure can be divided into discrete meshes by a powerful automeshing portion of the program. The program has three choices of meshing—Solid meshing (meshing of the Solid or core), Midplane meshing (meshing at the midplane) and Plate or Shell meshing (meshing of a surface). All of these choices require the material of the structure to be homogenous to produce a valid solution. However, a composite structure is made of at least two different materials and, therefore, is not homogenous. The thicker material or part of the composite (the matrix or the core) can be represented by discrete volumes, such as brick and tetrahedron elements, and the thinner parts (coatings or laminates) can be depicted by shell or plate elements. Composite structures are very complex to analyze. However, when the problem is broken into brick elements (discrete volumes) for the matrix core and plate or shell elements for the surface coating, the complex composite structure becomes easier to solve. This was the technique used in U.S. Pat. No. 6,721,684. Now, software, such as Algor, provides automeshing for either solid or plate and shell parts, but not in a combined form, such as a composite. Therefore, these programs could not provide a valid solution for a complex composite structure.

BRIEF DESCRIPTION OF THE INVENTION

This invention discloses a method for providing a valid solution for a composite structure using FEA programs. For composites having a core with a thin coating or laminate added to one or both major surfaces, the coating is treated as a Plate and is added to the Solid (core) of the structure. The FEA of the resulting structure under various types of loading provides a valid solution.

The method of the invention constructs the solid elements of the core of the building using automatic meshing engines offered by software manufacturer such as ANSYS, NASTRAN, ANGOR, ABACUS and ABAQUS. The meshing engine or program creates surface mesh on the inner, outer and edge surfaces of the structure or building. The FEA program meshes or divides the core up into discrete volumes, such as Bricks and Tetrahedra.

The surface coating material of the composite building is constructed. This is accomplished by copying the surface mesh lines of the core and by using the surface mesh to construct plate or shell elements on top of the surface mesh of the core. The copying is done at zero distance from the surface mesh of the core. After copying the mesh of the inner and outer surfaces of the building, the copy is given a part number, and the mechanical and dimensional properties of the coating are entered. Then, the Solid Meshing of the core is done. Then, the FEA (problem) can be solved for the composite building.

DETAILED DESCRIPTION OF THE INVENTION

Figure 1:
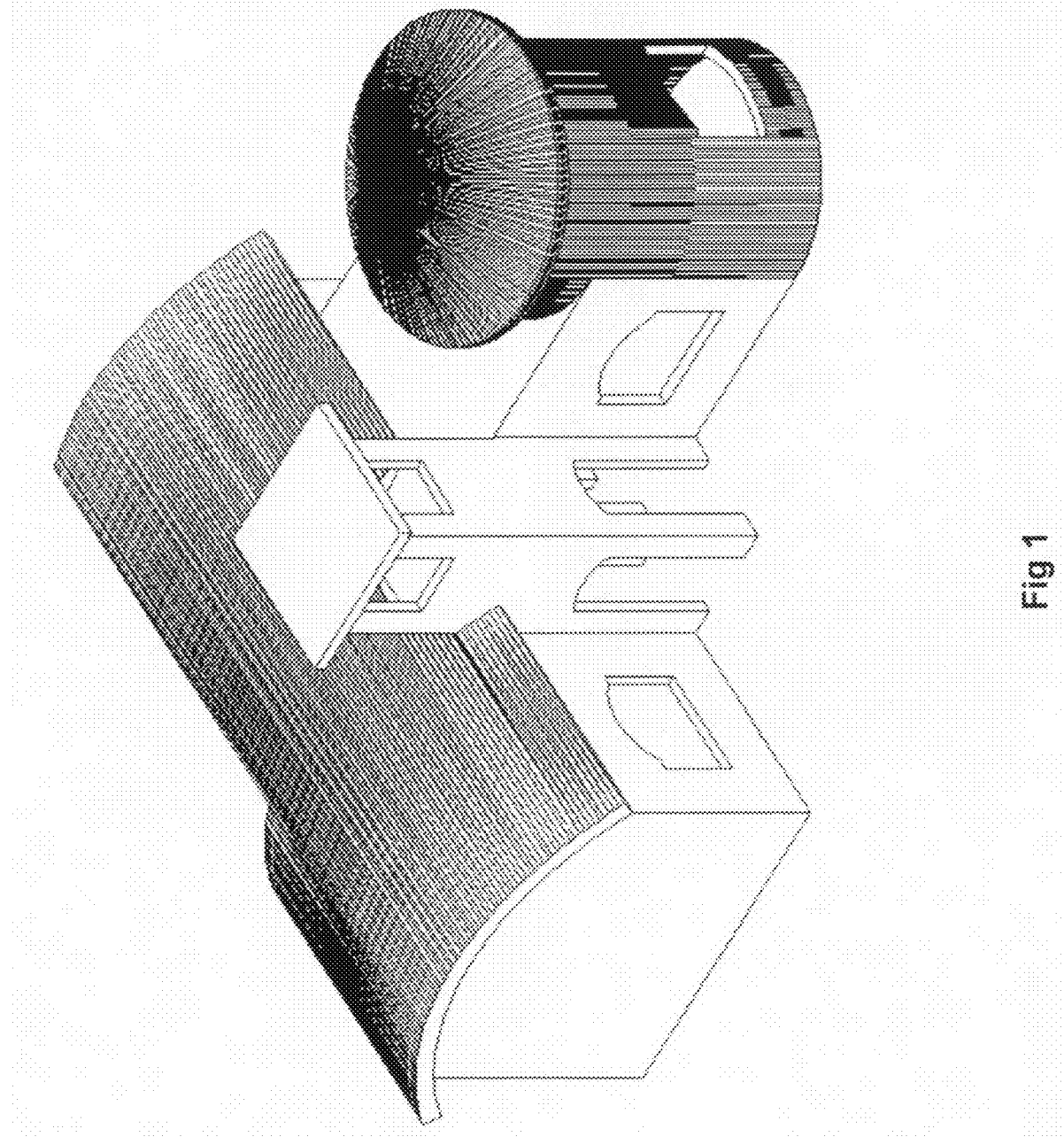
FIGS. 1-40 are perspective views of the invention.

FIG. 1 shows the rendering of a building created in 3D solid format using an CAD program or software. The program used here is Mechanical Desktop. The CAD program may also be a program or software, such as AutoCAD, Solidworks, Alibre, etc.

Figure 2:
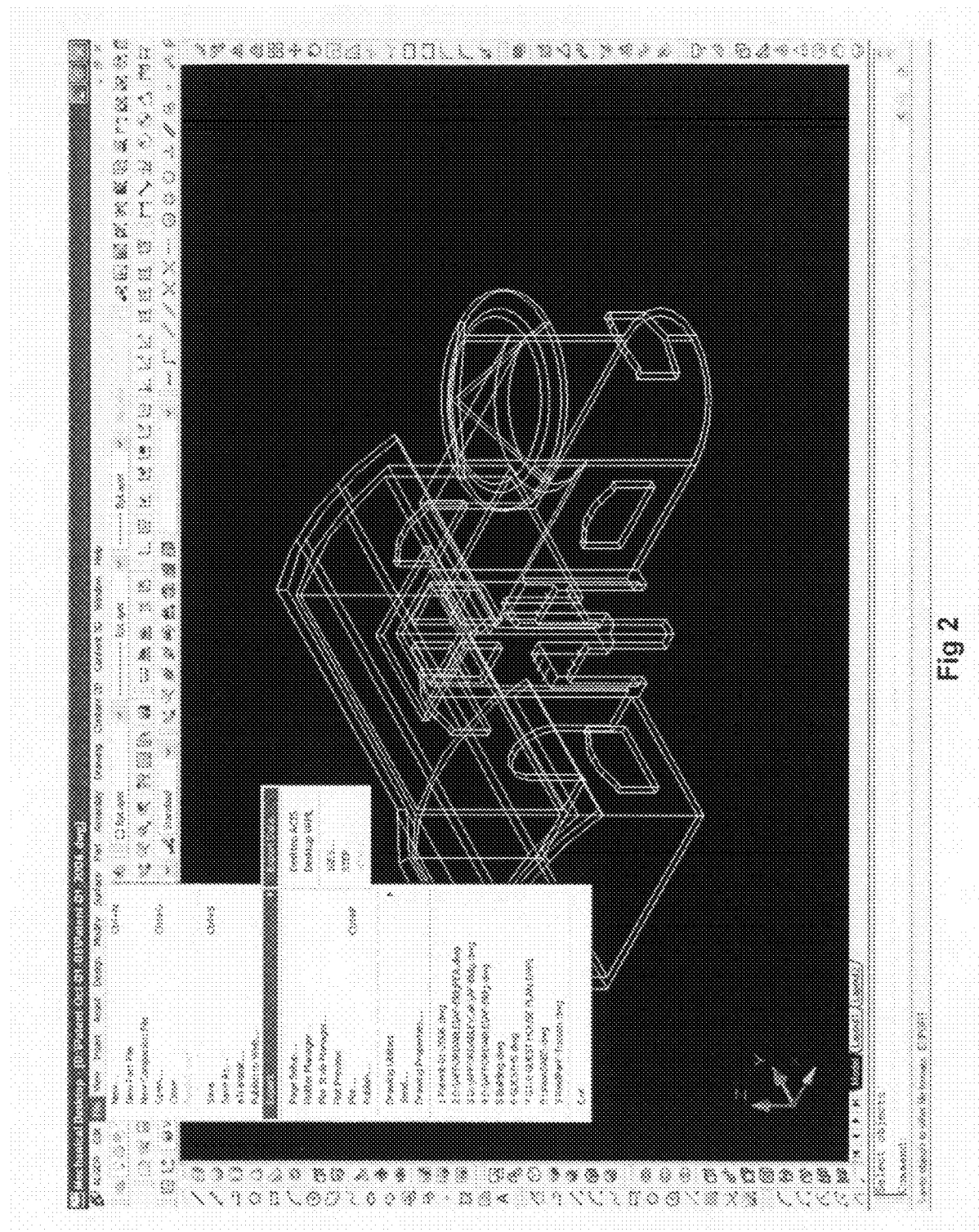
Figure 4:
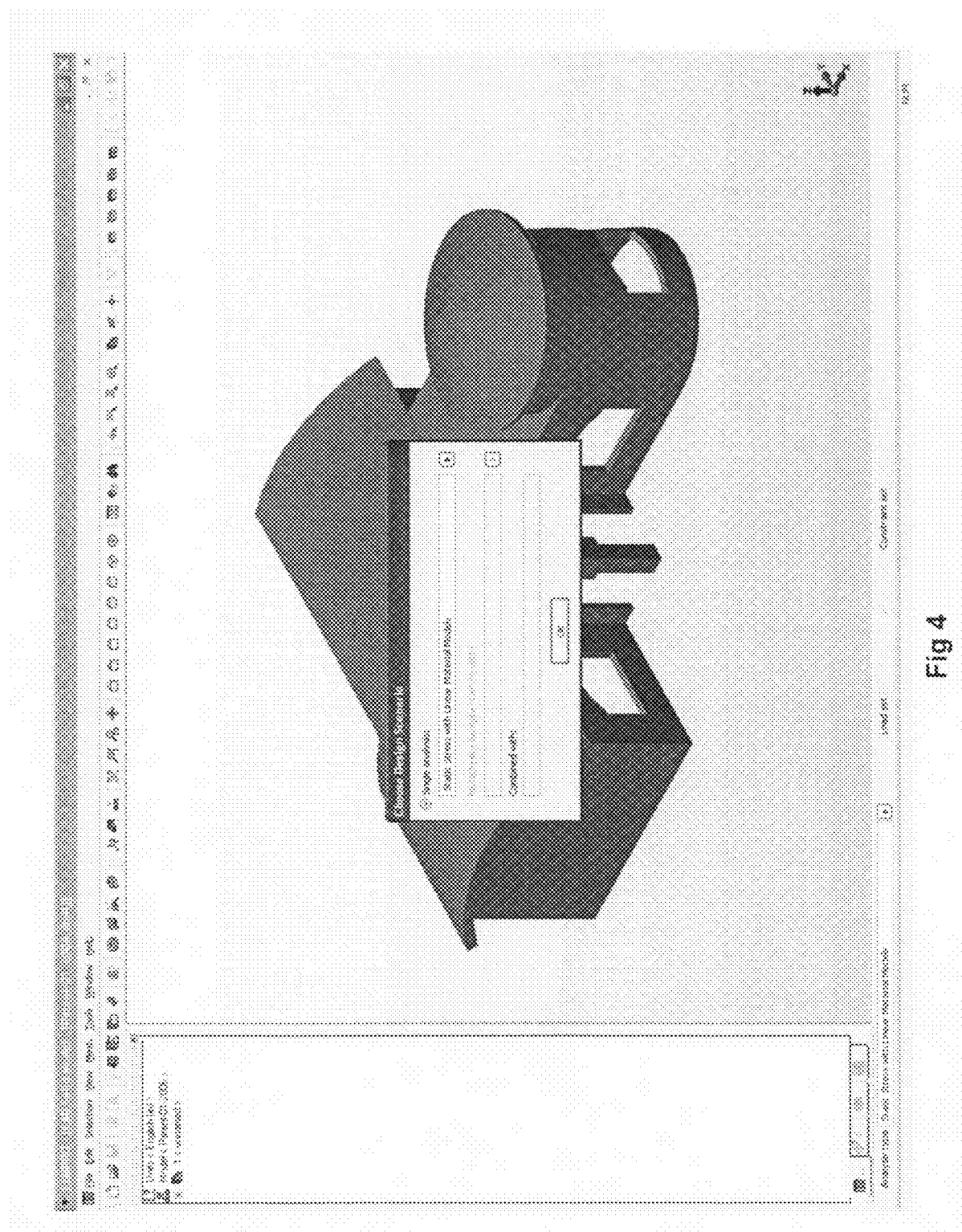

FIG. 2 shows the exporting of the 3D CAD drawing file using a compatible format that can be exported out of the CAD program (Mechanical Desktop) and imported by a Finite Element Analysis (FEA) program or software, such as Algor FEMPRO (FIG. 4). Depending on the FEA program, a different output or export format defining the solid model is selected. These formats maybe of the file type that have the extension STEP, IGES and SAT. The building is to be worked on in one piece or united. In this example, the name of the CAD file being exported in SAT format is named "Patent-01-2006.dwg" which after the conversion it is named "Patent-01-2006.sat". This figure shows the exporting of the CAD file into a sat file. The exporting is accomplished by clicking on File, then clicking on Export from the Menu and then clicking on the selected format. The building parts are Unioned in the CAD program to create a one-piece building core designated as Part 1.

Figure 3:
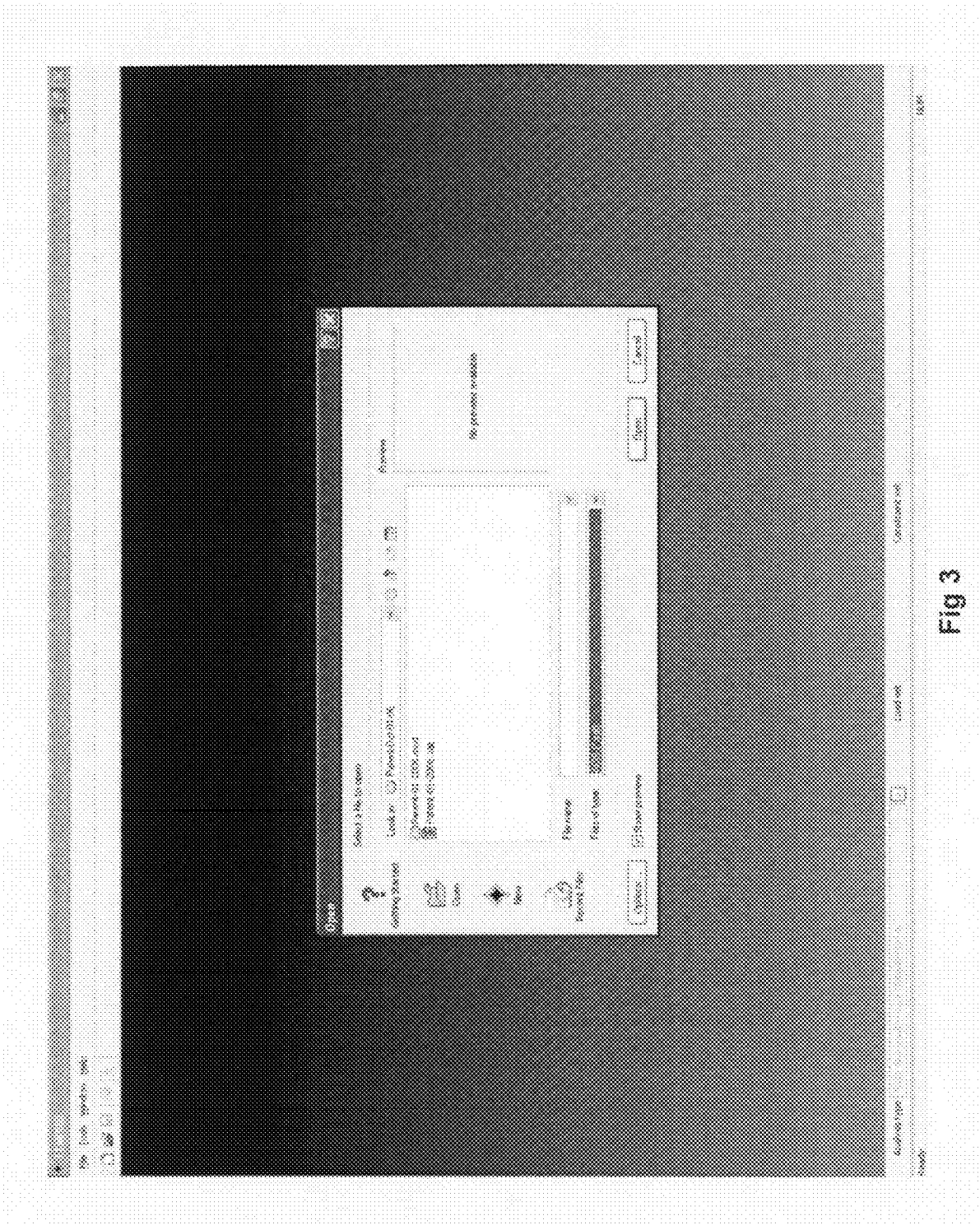

FIG. 3 shows the Algor (FEMPRO) program display which allows the opening of the file Patent-01-2006.sat. The file is selected and opened.

FIG. 4 shows the building in FEMPRO and a display that comes up when the file is opened. The display Choose Design Scenario comes up, Single Analysis: Static Stress with Linear Material Models is chosen and the OK button is clicked and the next display comes up.

Figure 5:
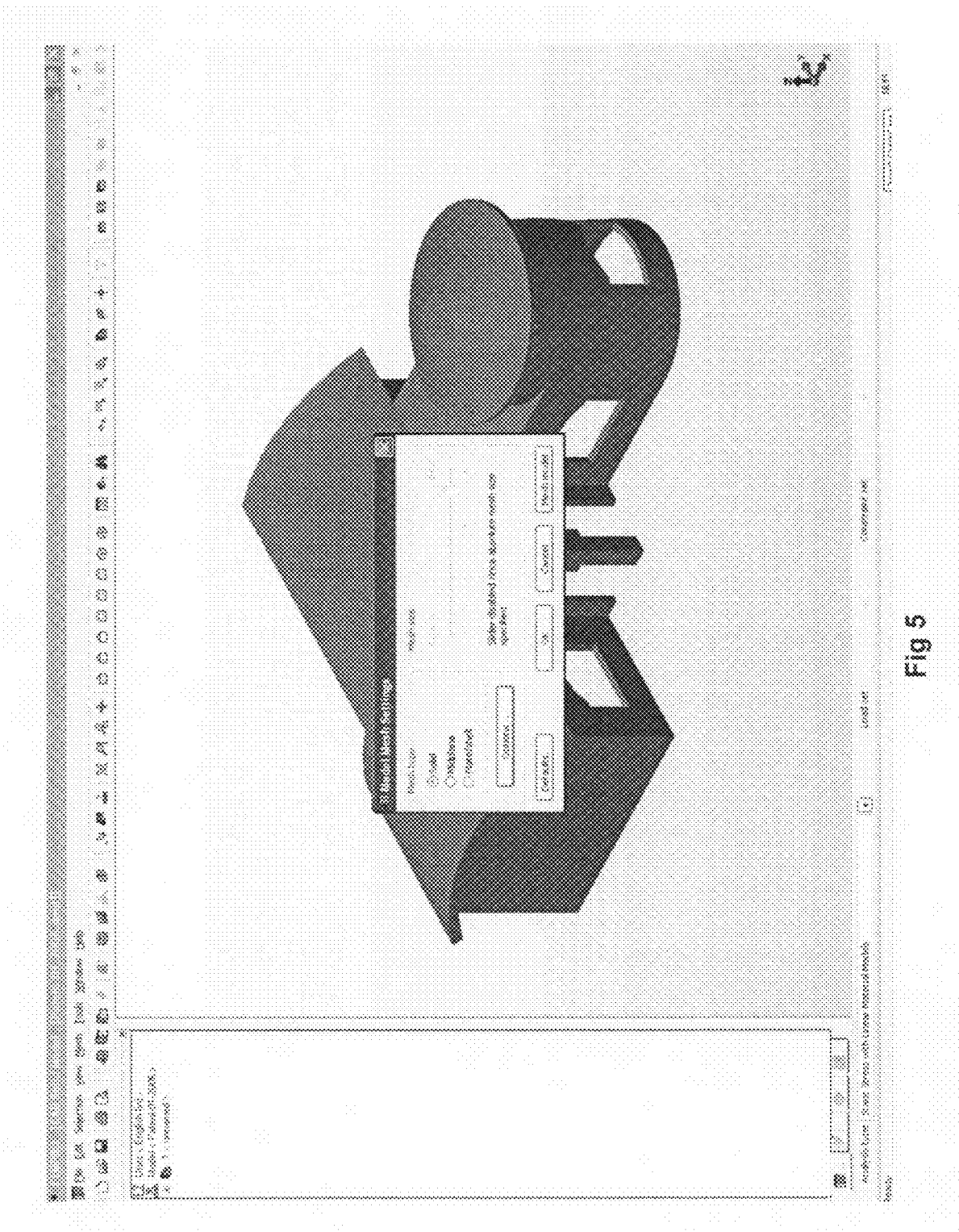

FIG. 5 shows the next display. The Algor program display which allows the user to chose type of mesh and the dimension, size or the degree refinement of the surface mesh which can be defined as a percentage of the total object or in inches or millimeters. Solid Mesh has been chosen. Note that even though Mesh type—Solid is chosen, only the surfaces of the solid will be meshed. The inner, outer and edge surfaces of the building are meshed. Next the Options button is clicked.

Figure 6:
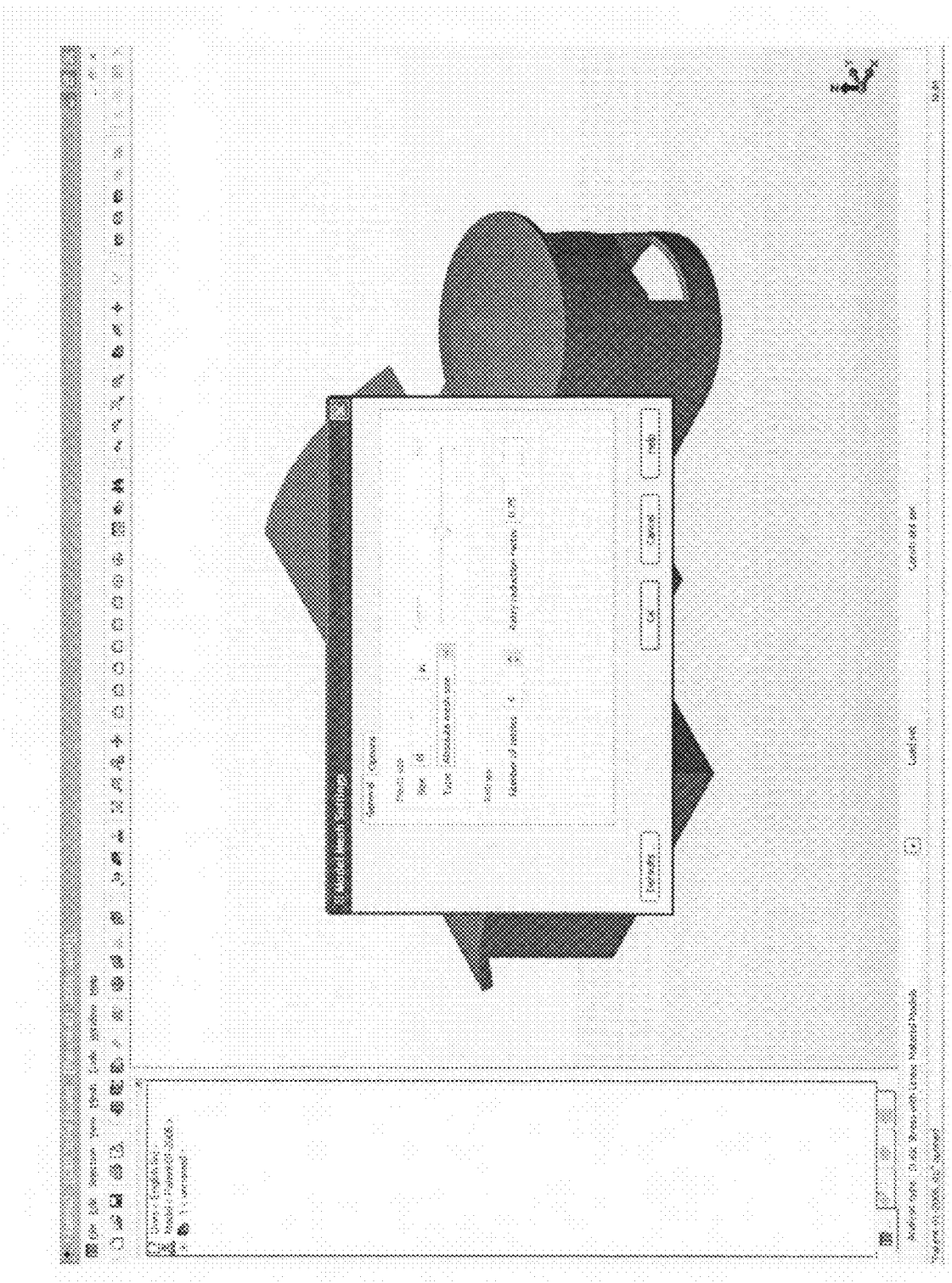

FIG. 6 shows the display of the Options of the display of FIG. 5. In this example, the nominal size of the mesh is chosen as 8 inches as an Absolute mesh size. The program by default will retry fitting the mesh into the smaller areas for six retries or six times. This prevents the program from getting hung up in trying to mesh an area. The Retry reduction factor is 0.75 inches. The meshing process is started by clicking the OK button.

Figure 7:
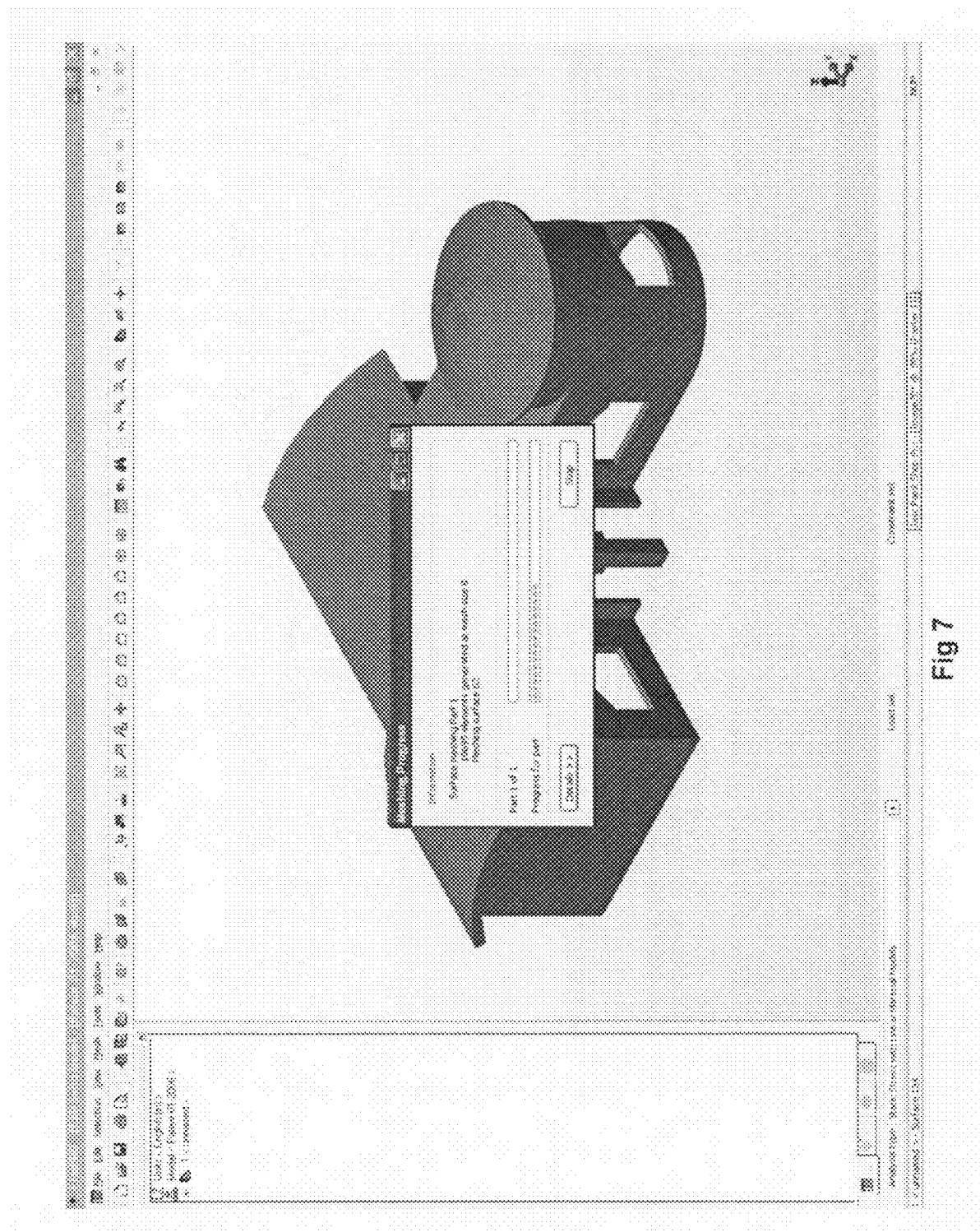

FIG. 7 shows the display for the Meshing Progress display which comes up during the meshing process.

Figure 8:
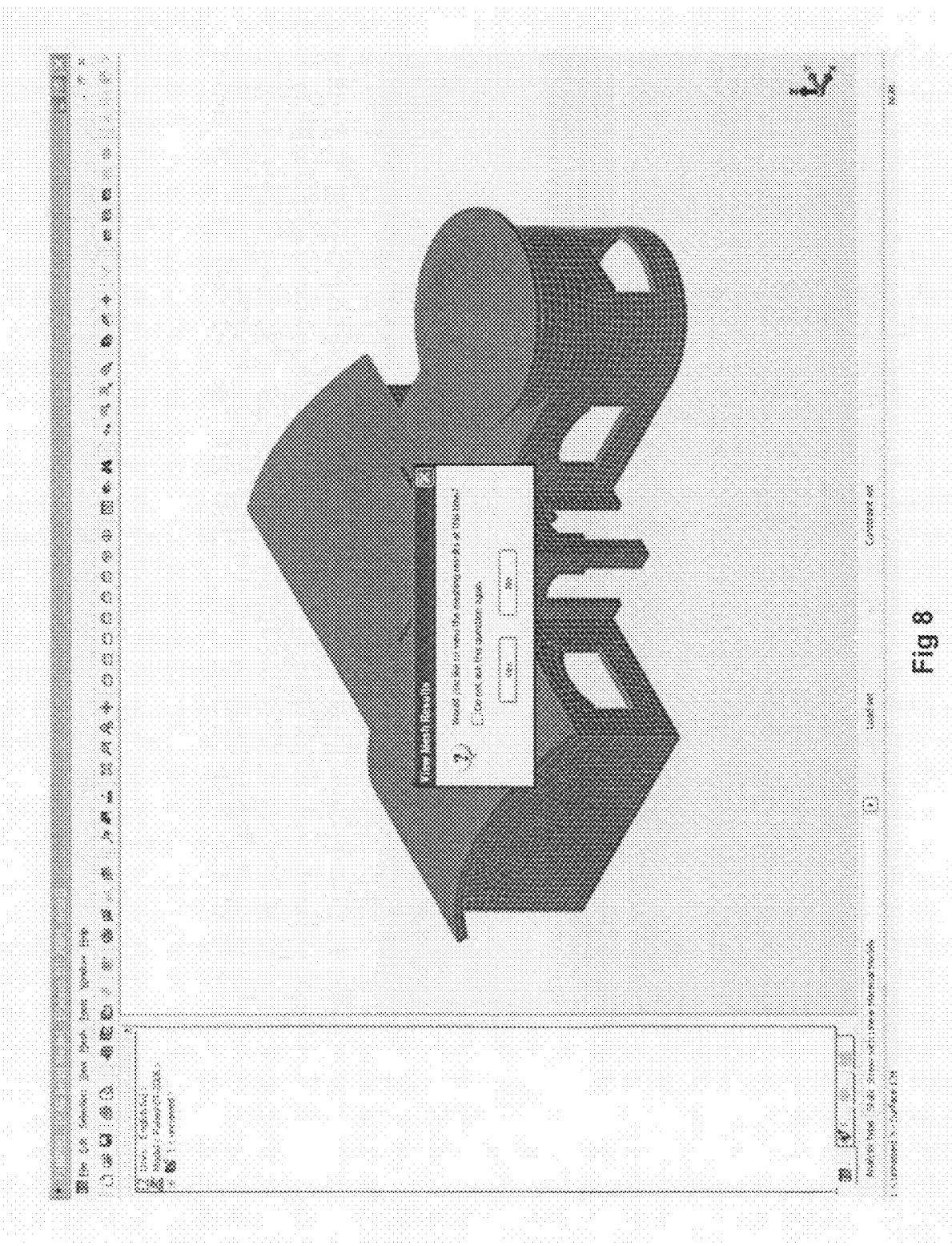

FIG. 8 shows the Results display of a successful automatic surface meshing of the part, structure or building. All of the surfaces (inner, outer and edge) of the building are meshed as shown in the figure. The Yes button is clicked, and the next display comes up.

Figure 9:
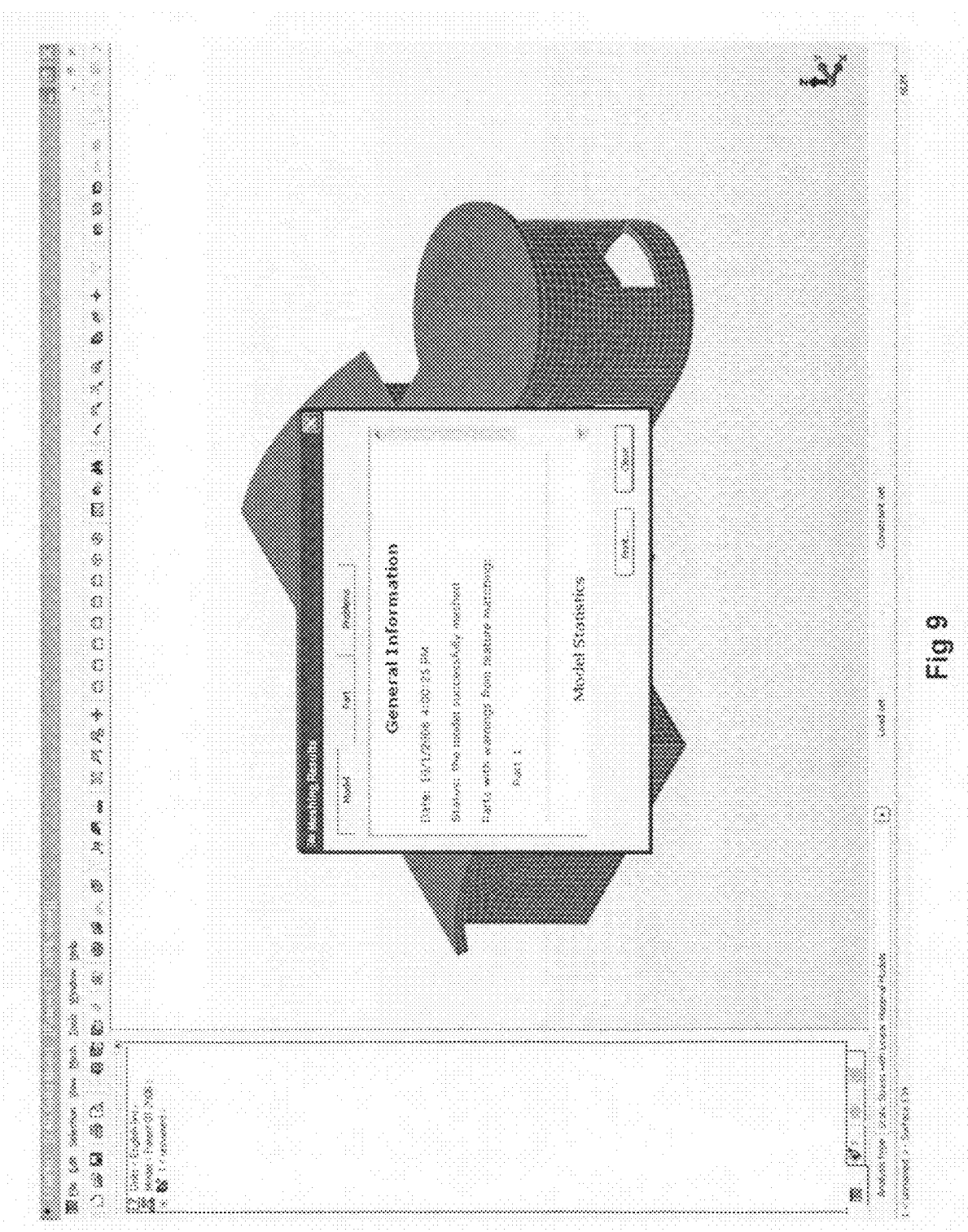

FIG. 9 shows the next display. The next display is the Meshing Results display that gives more information.

Figure 10:
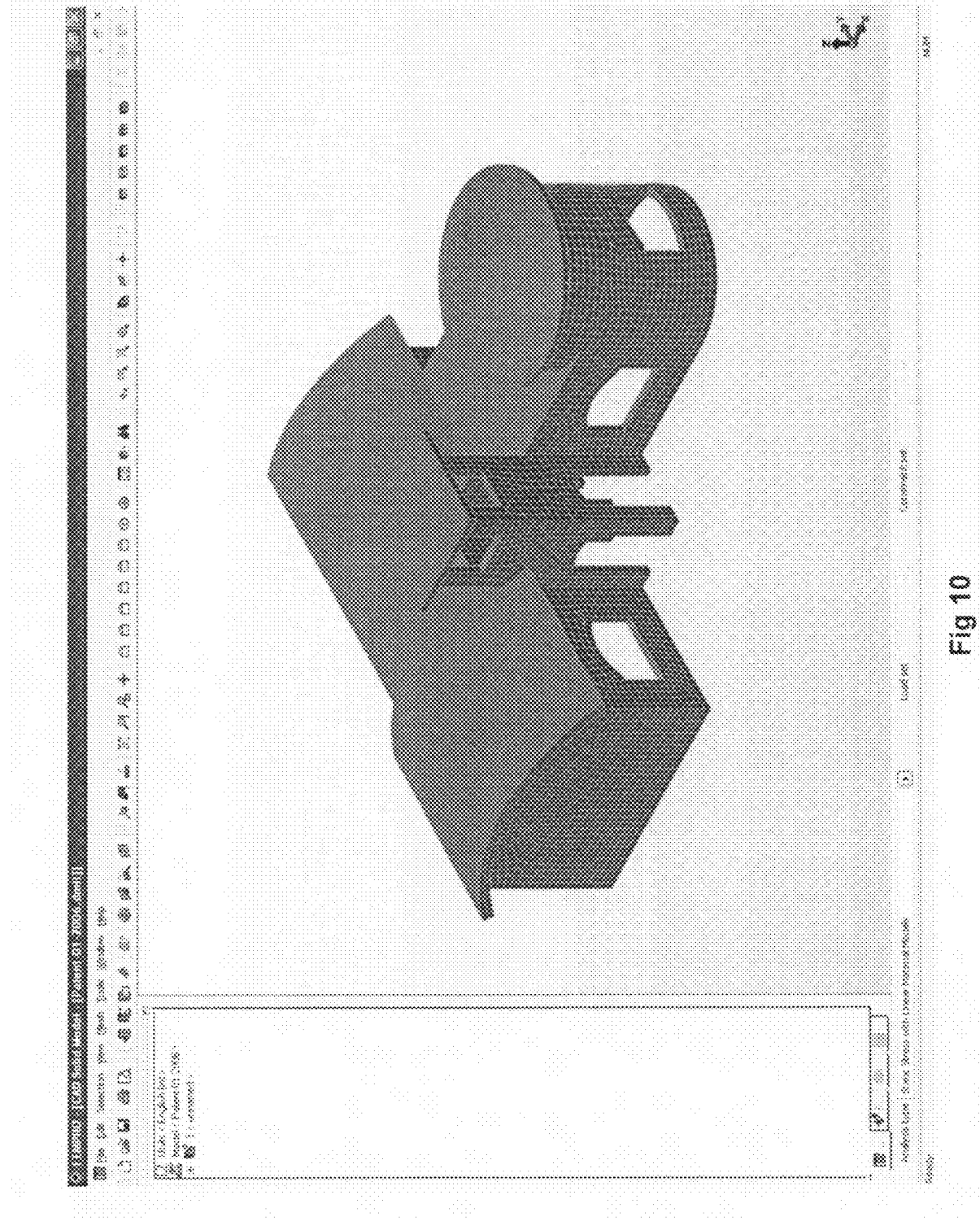

FIG. 10 shows the meshed building without the display which has been closed.

Figure 11:
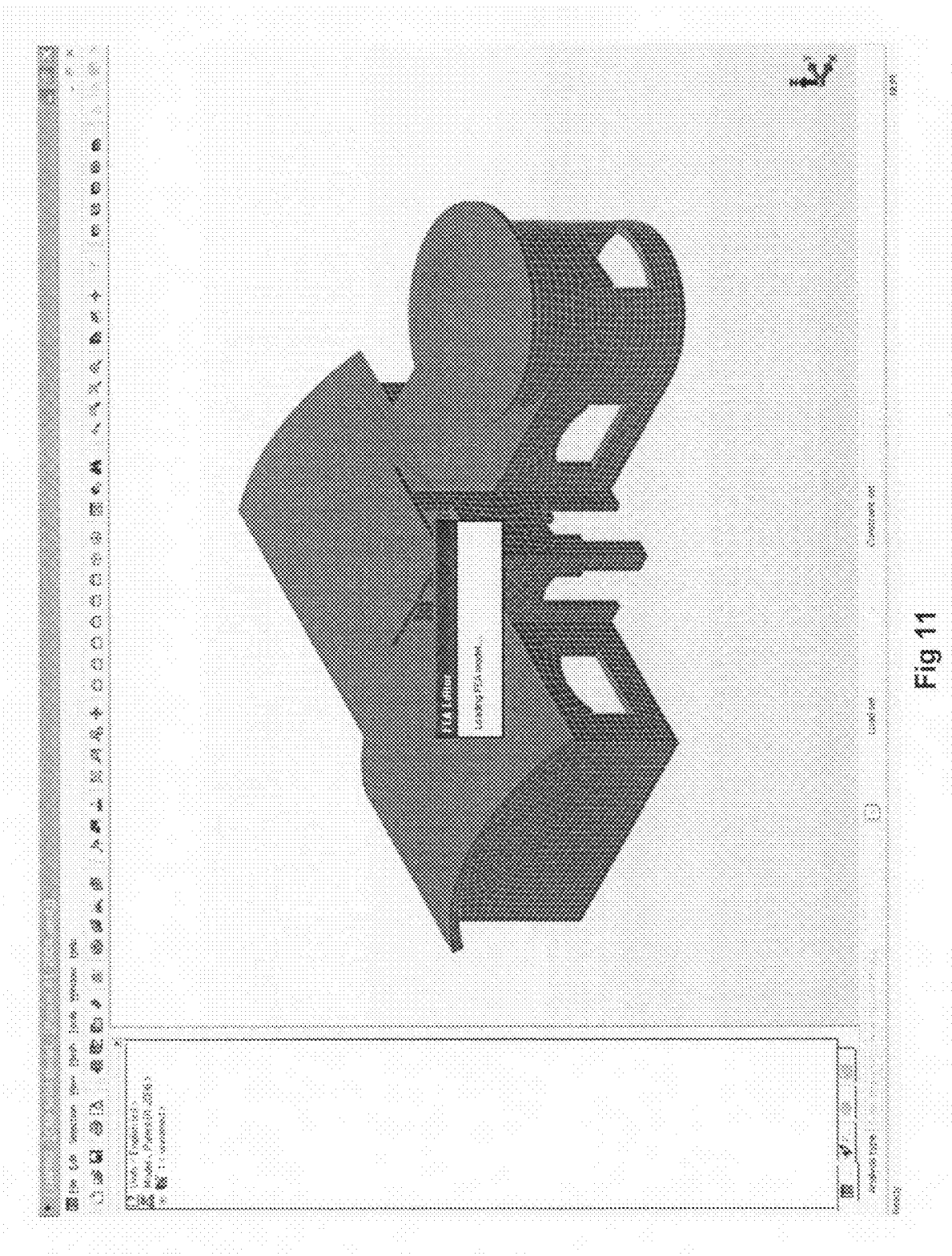

FIG. 11 shows the selection of FEA Editor which can be started by clicking on the second button from the left at the bottom of the screen display with a capital F. When clicked, the FEA Editor loads the meshed model.

Figure 12:
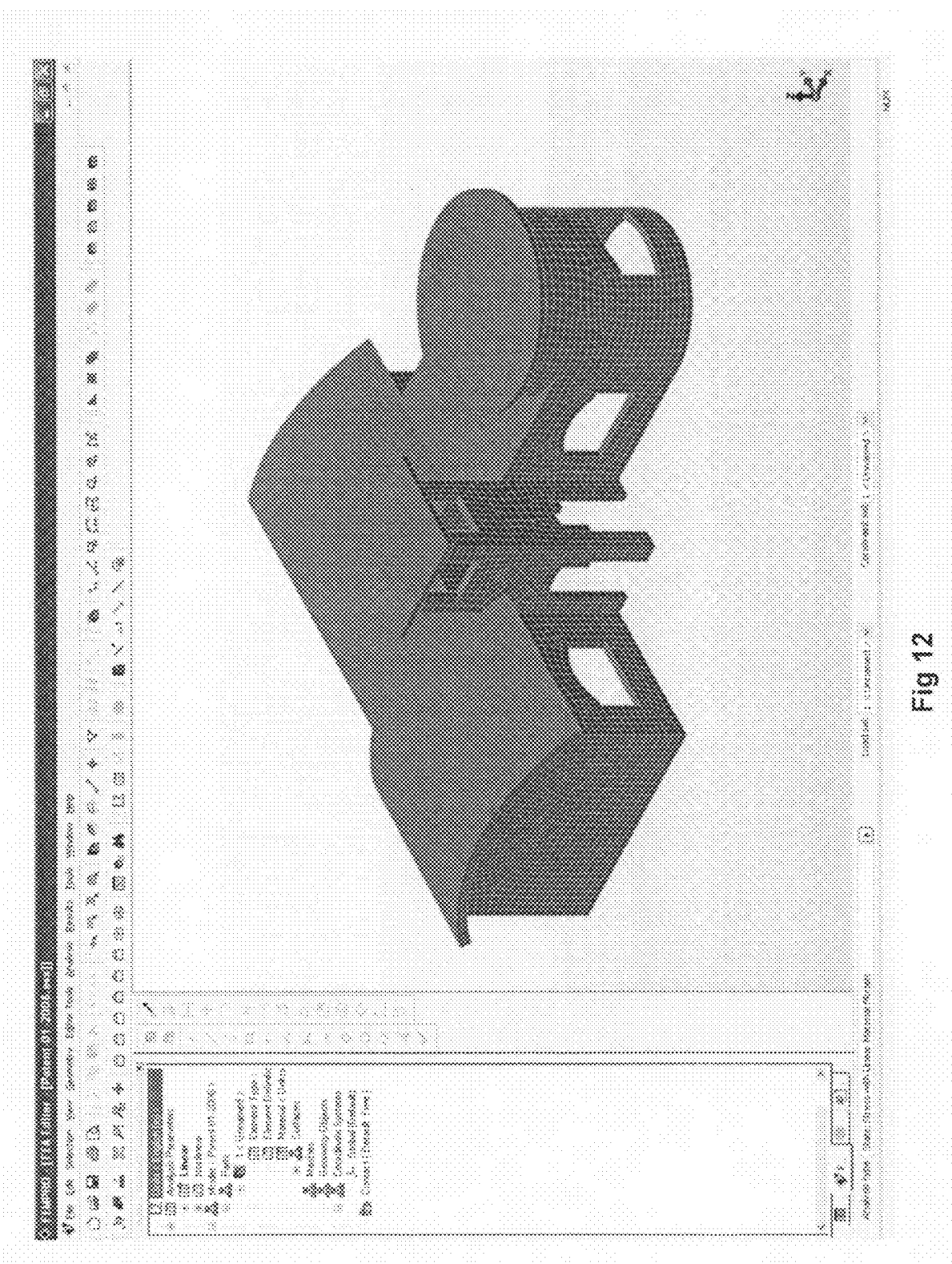

FIG. 12 shows display for the FEA Editor in the menu on the left middle section of the screen display. This display allows information to be added about the parts. The properties of the material can be added here. The thickness has been exported into FEMPRO from the dimensions in the CAD file. Here the information about the core is being provided. The core is EPS (Expanded Polystyrene). The information about the EPS is obtained from form the designer's Library which has been imported into the Algor FEMPRO program. The information about the core and the coating is placed into the Library by the user. The information is entered by clicking on Element Type, Definition and Material.

Figure 13:
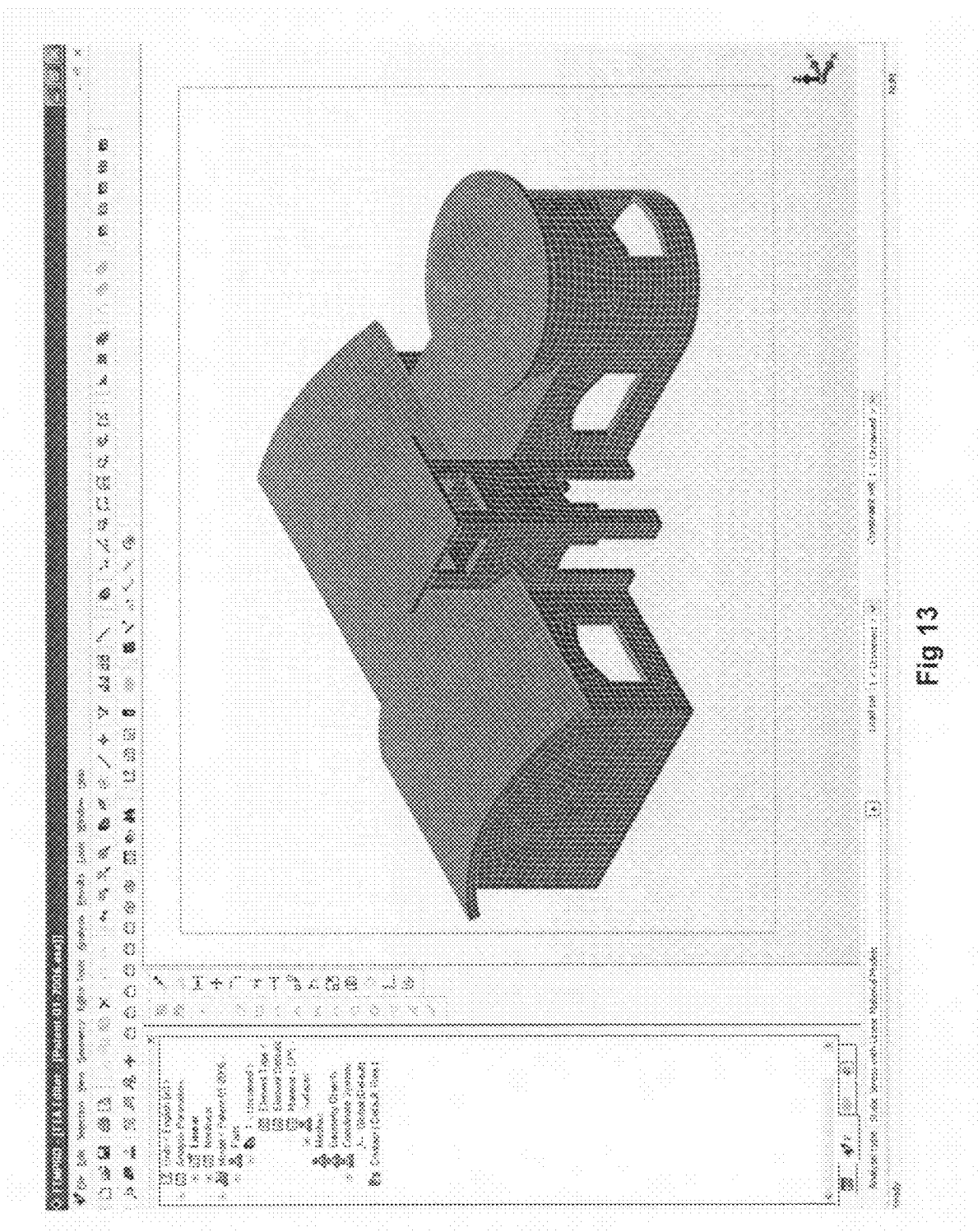

FIG. 13 shows the information added for Part 1. The Material—EPS—is the only portion visible on the screen. The Element Type is Brick.

Figure 14:
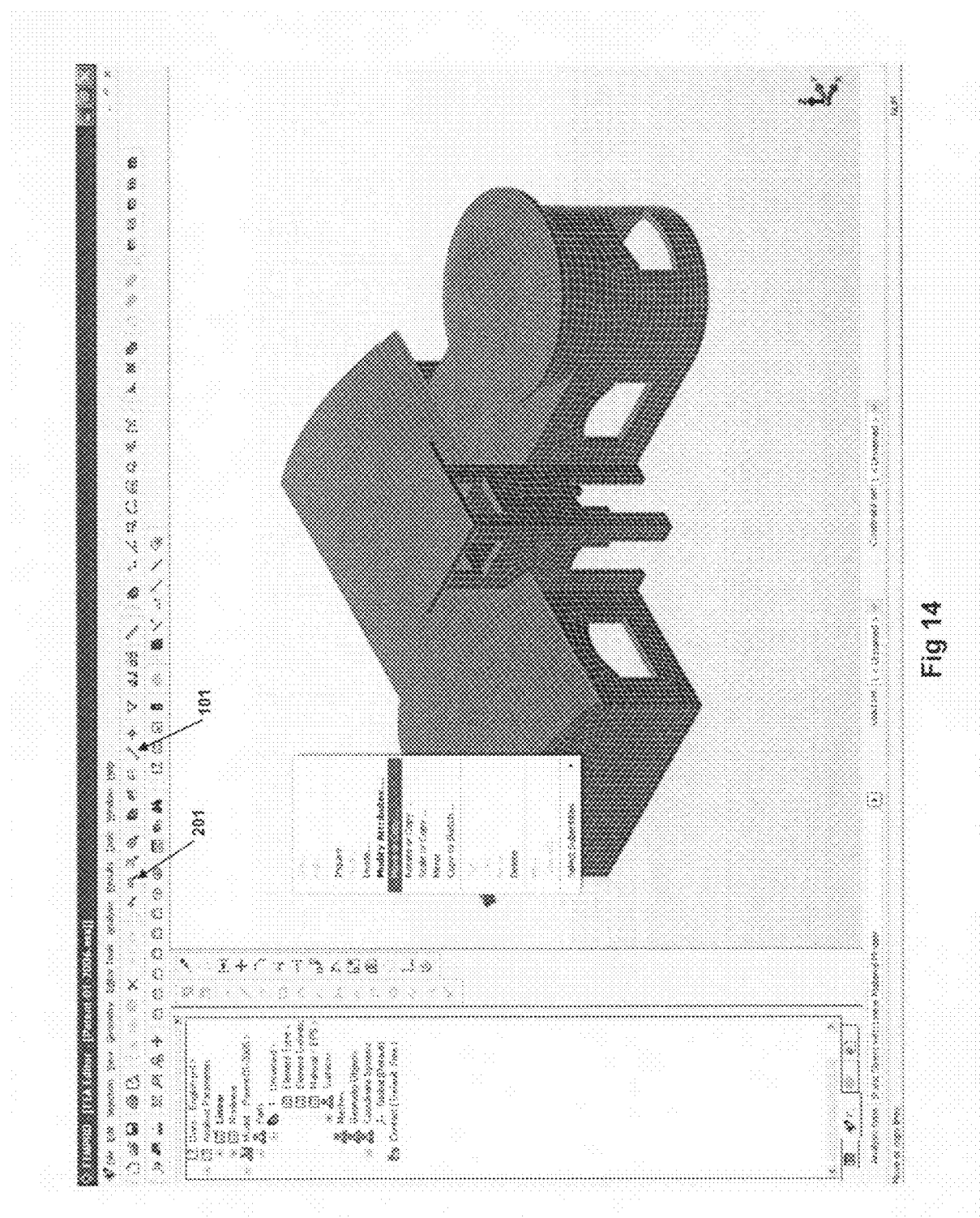

FIG. 14 shows a menu that comes down when a right click is performed. Move or Copy is selected. Before the menu is accessed, tool icon 101 is clicked to select lines. Then, the tool icon 201 for selecting an area is clicked. Then, the whole the structure is selected by using the tool from icon 201 to create an area enclosing the whole building. Alternatively, the Selection button can be clicked, and then the Select All clicked. Then, the menu is accessed to select Move or Copy.

Figure 15:
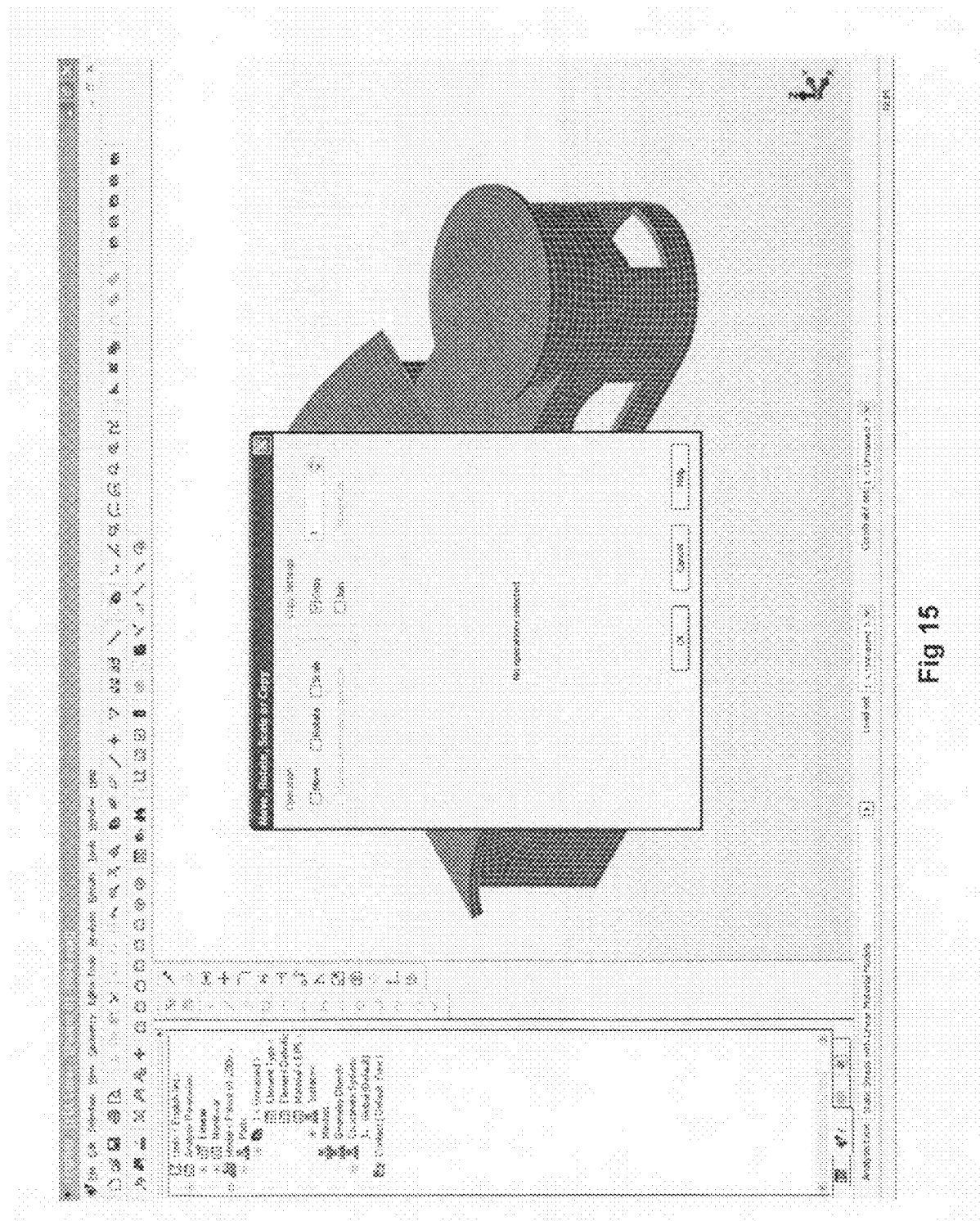

FIG. 15 shows the display for Move or Copy. Copy and the number of copies (1) are selected, and the OK button clicked.

Figure 16:
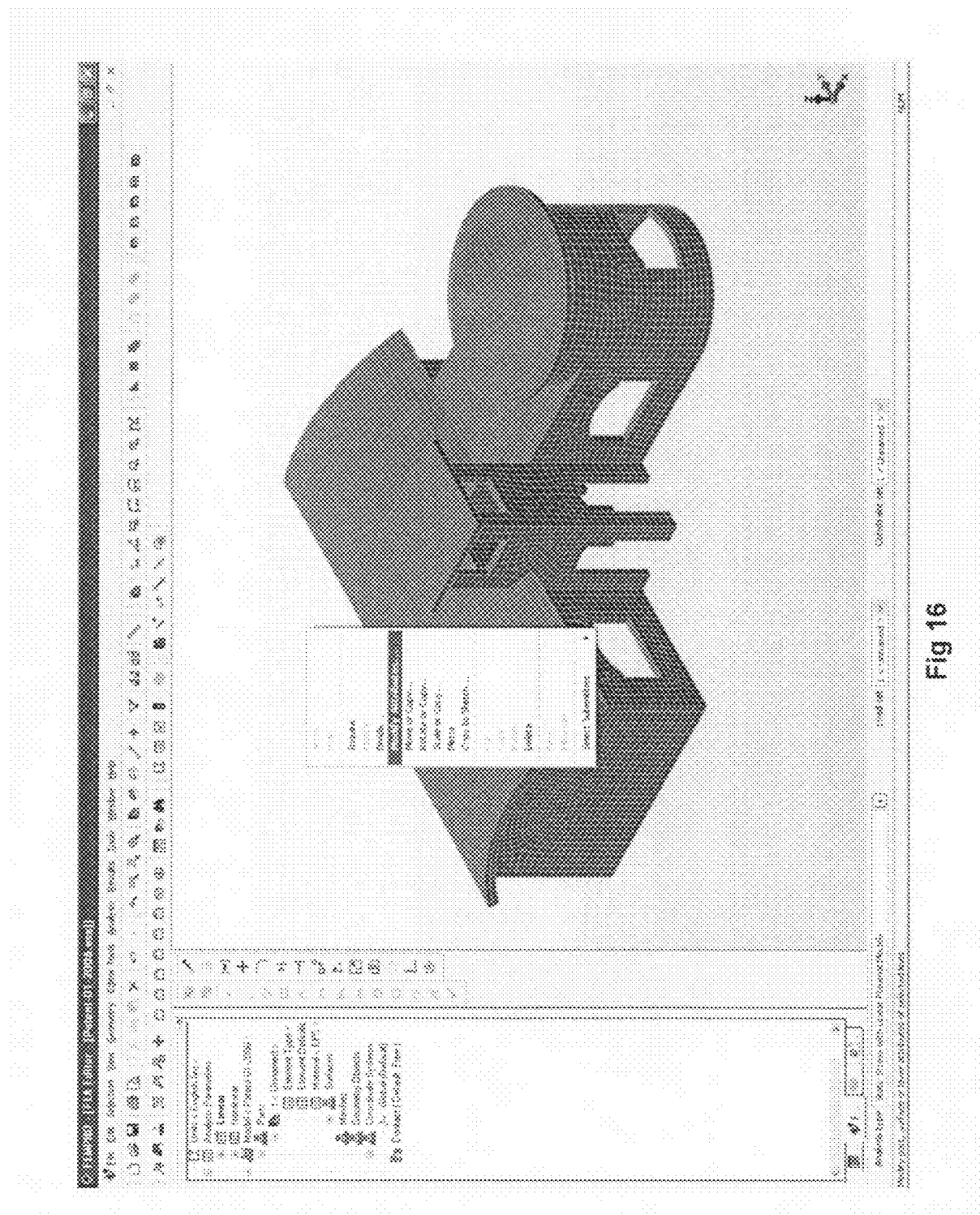

FIG. 16 shows the menu again that is displayed by a right click. Modify Attributes is selected.

Figure 17:
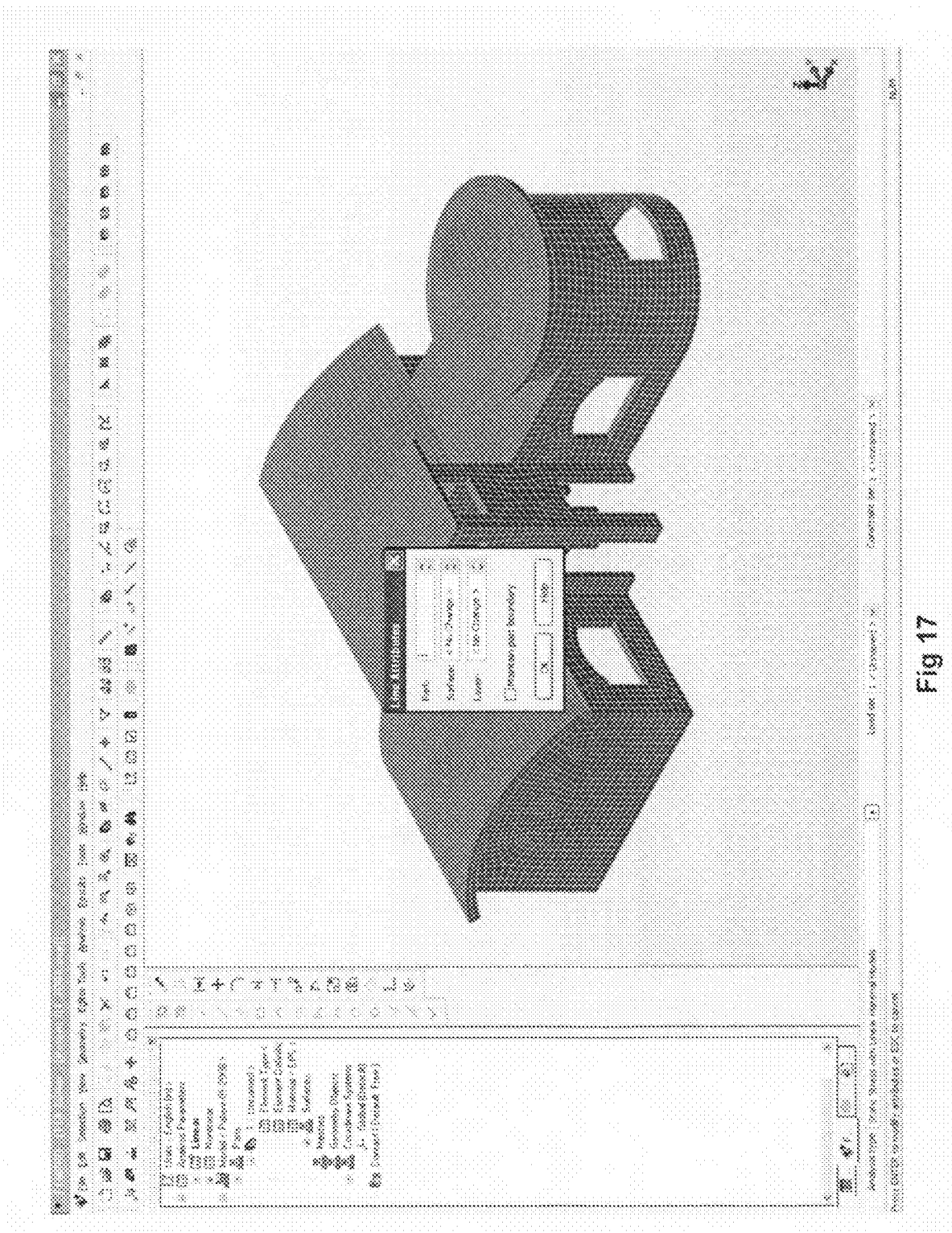

FIG. 17 shows the display that comes up when Modify Attributes is selected. This display allows the naming of the copy.

Figure 18:
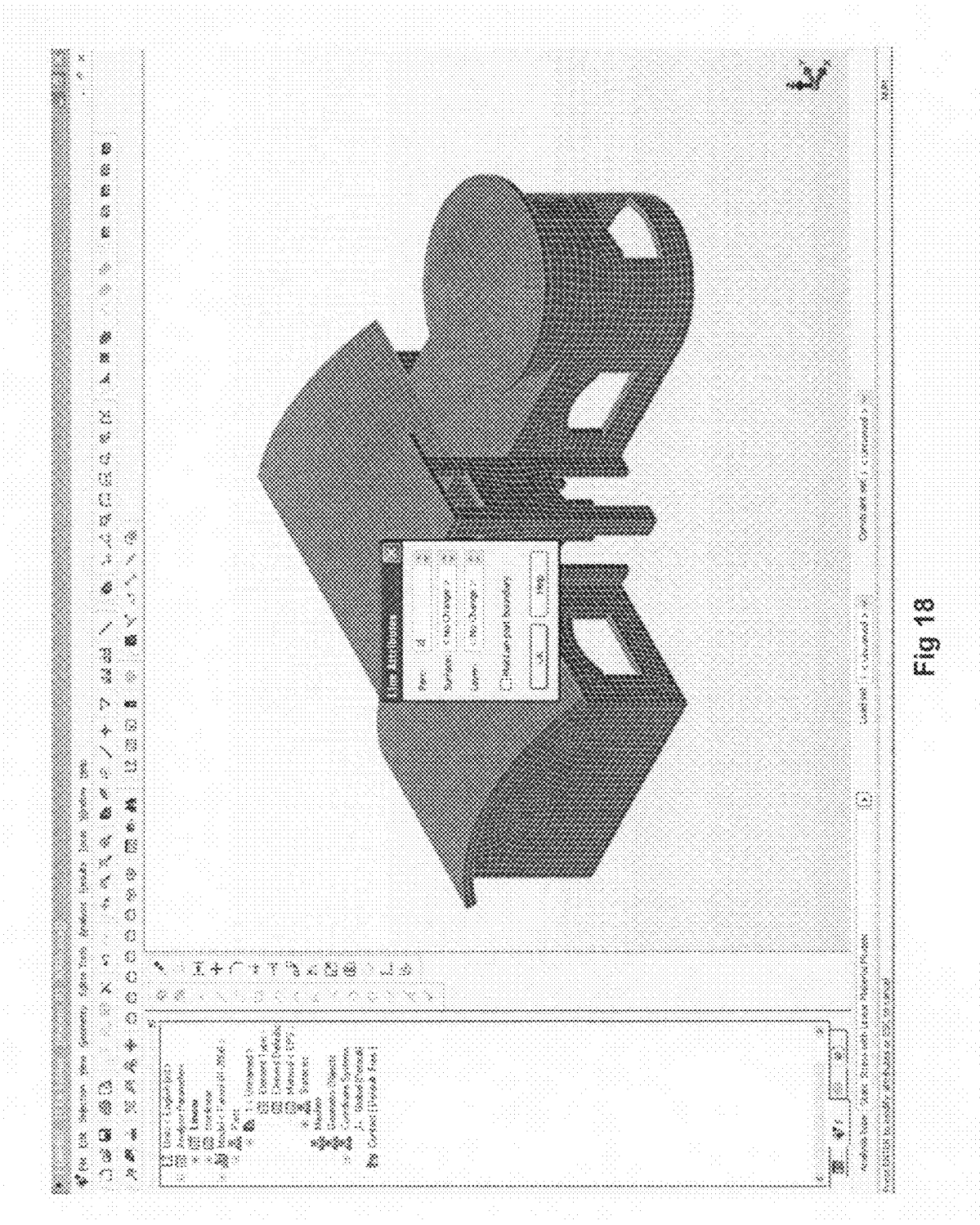

FIG. 18 shows the Copy being named Part 2, and OK is clicked.

Figure 19:
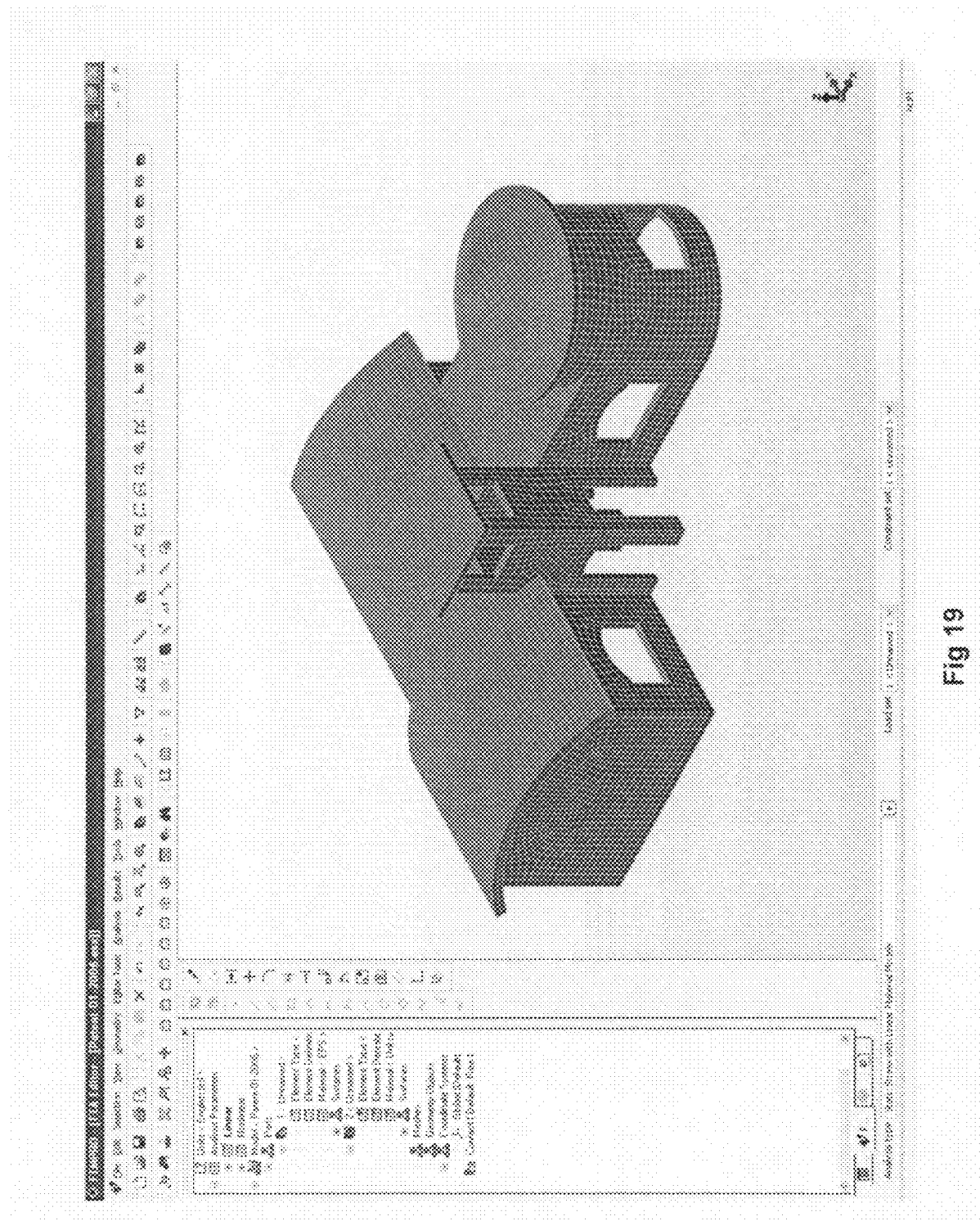

FIG. 19 shows newly created and named Part 2 in the display for the FEA Editor in the menu on the left middle section of the screen display. Part 2 has been created by the Copy command. All of the inner, outer and edge surfaces now have a copy (Part 2) of the surface mesh at zero distance from the surface mesh of the core (Part 1).

Figure 20:
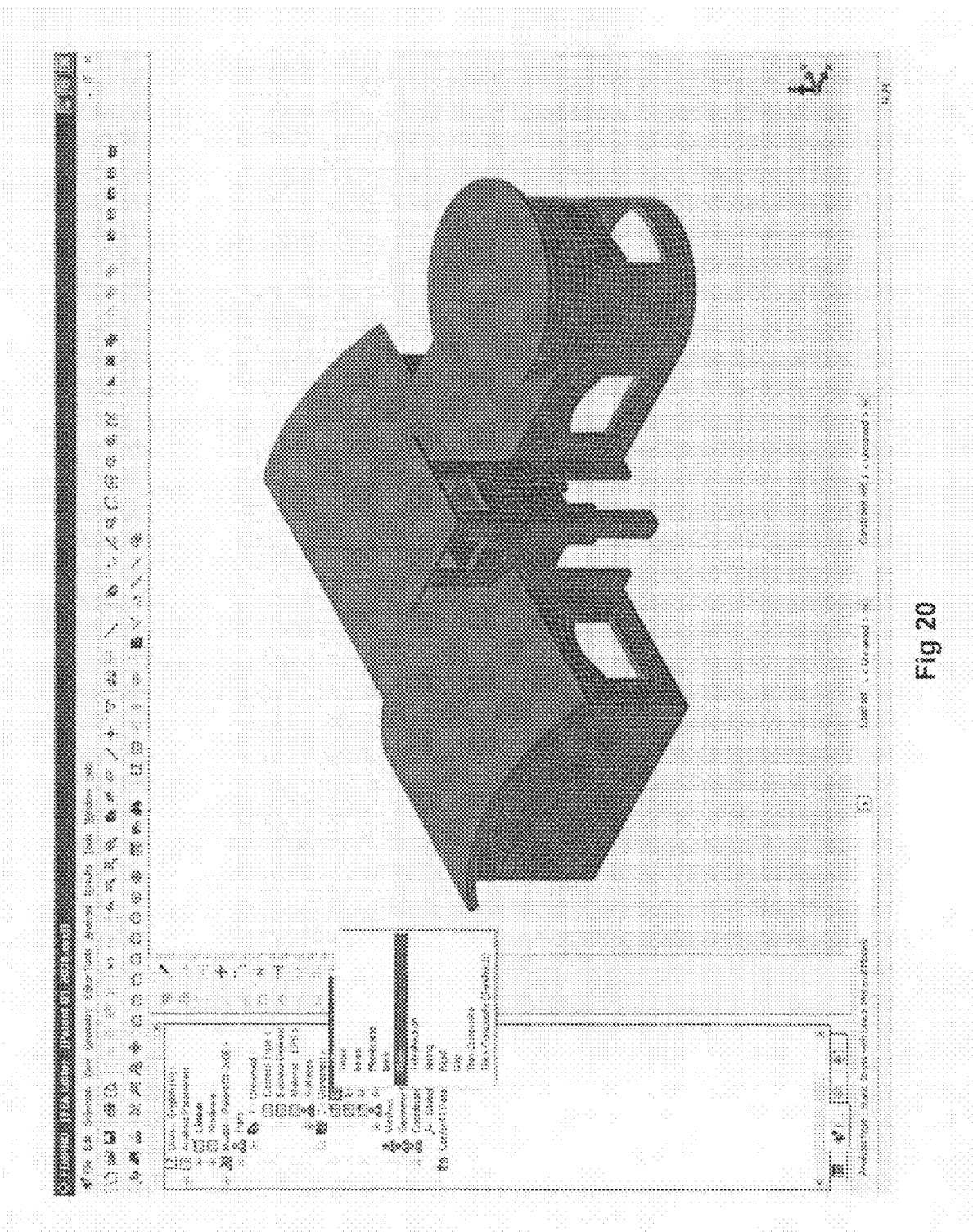

FIG. 20 shows the information about Part 2 being added. The Element Type is designated Plate.

Figure 21:
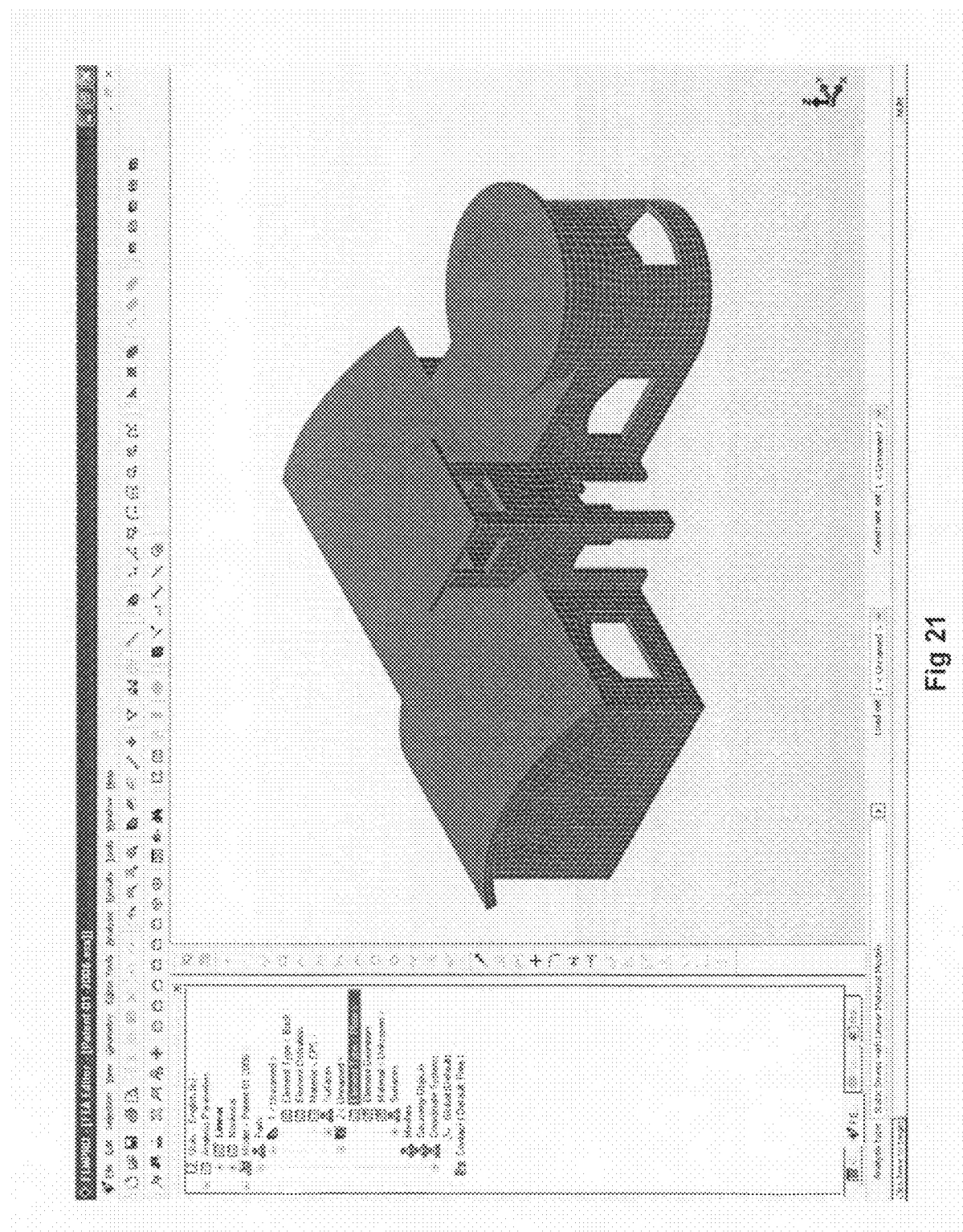

FIG. 21 shows the display with the information about Element Type added (Plate).

Figure 22:
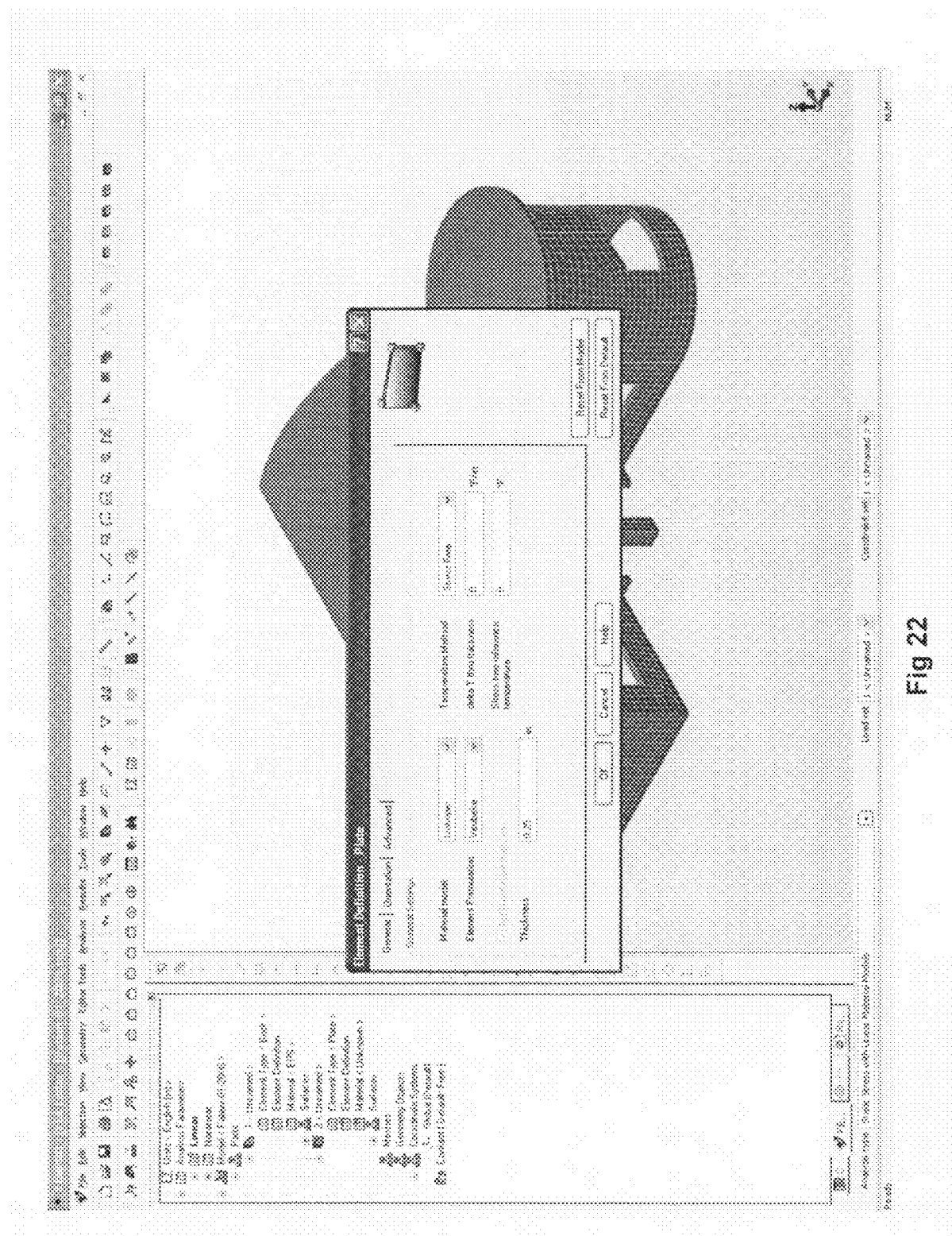

FIG. 22 shows the display for adding information about Element Definition which is accessed by clicking on Element Definition. Model Material and Element Formulation are default selections. The thickness of 0.25 inch is added, and the OK button clicked.

Figure 23:
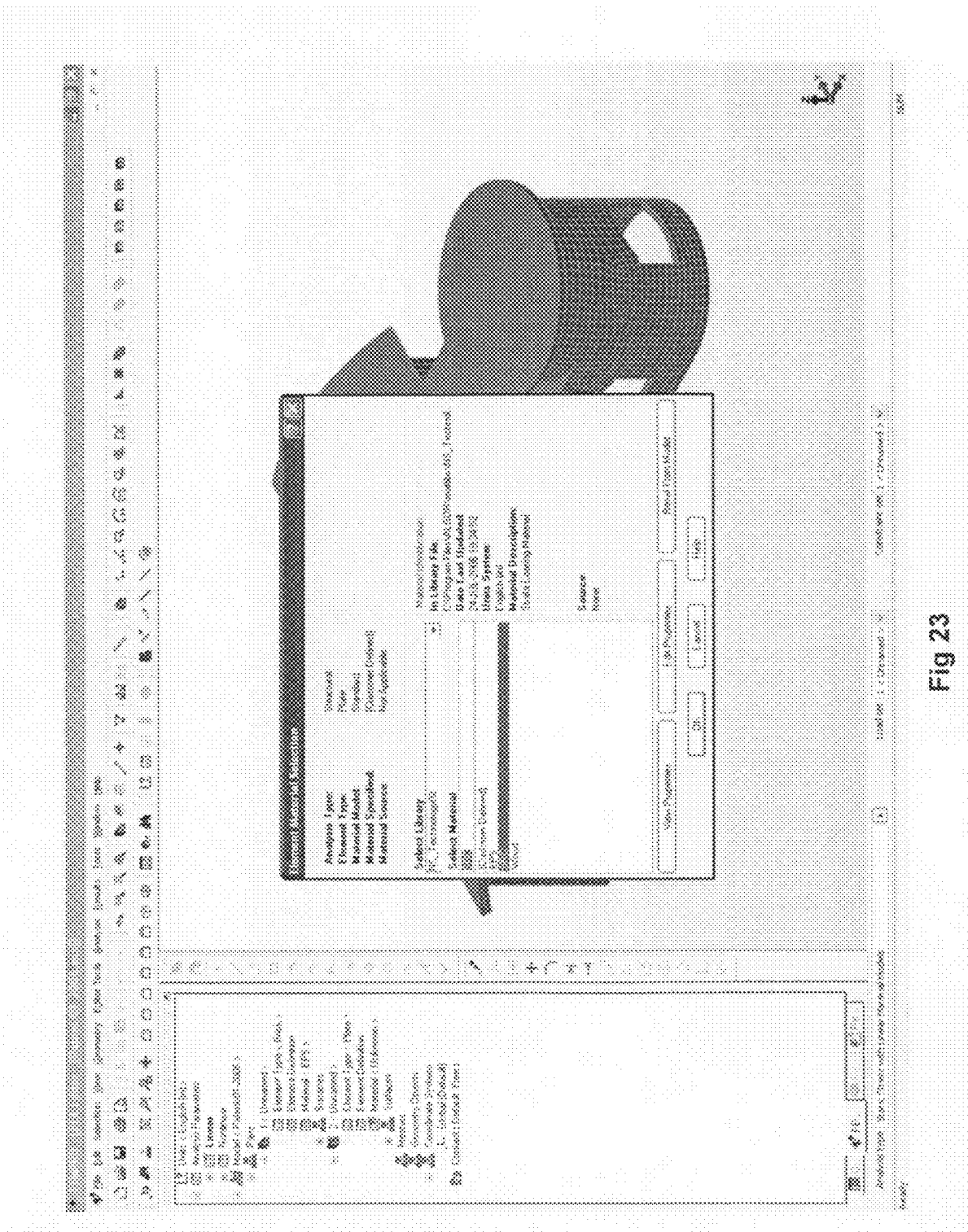

FIG. 23 shows the display for adding information about Material for Part 2. The Plate is SRC (a proprietary Glass Fiber Reinforced Concrete, GFRC, coating). The information about SRC is obtained from the designer's Library which has been imported into the Algor FEMPRO program. The information about the core and the coating is placed into the Library by the user. The information is entered by clicking on Element Type, Definition and Material.

Figure 24:
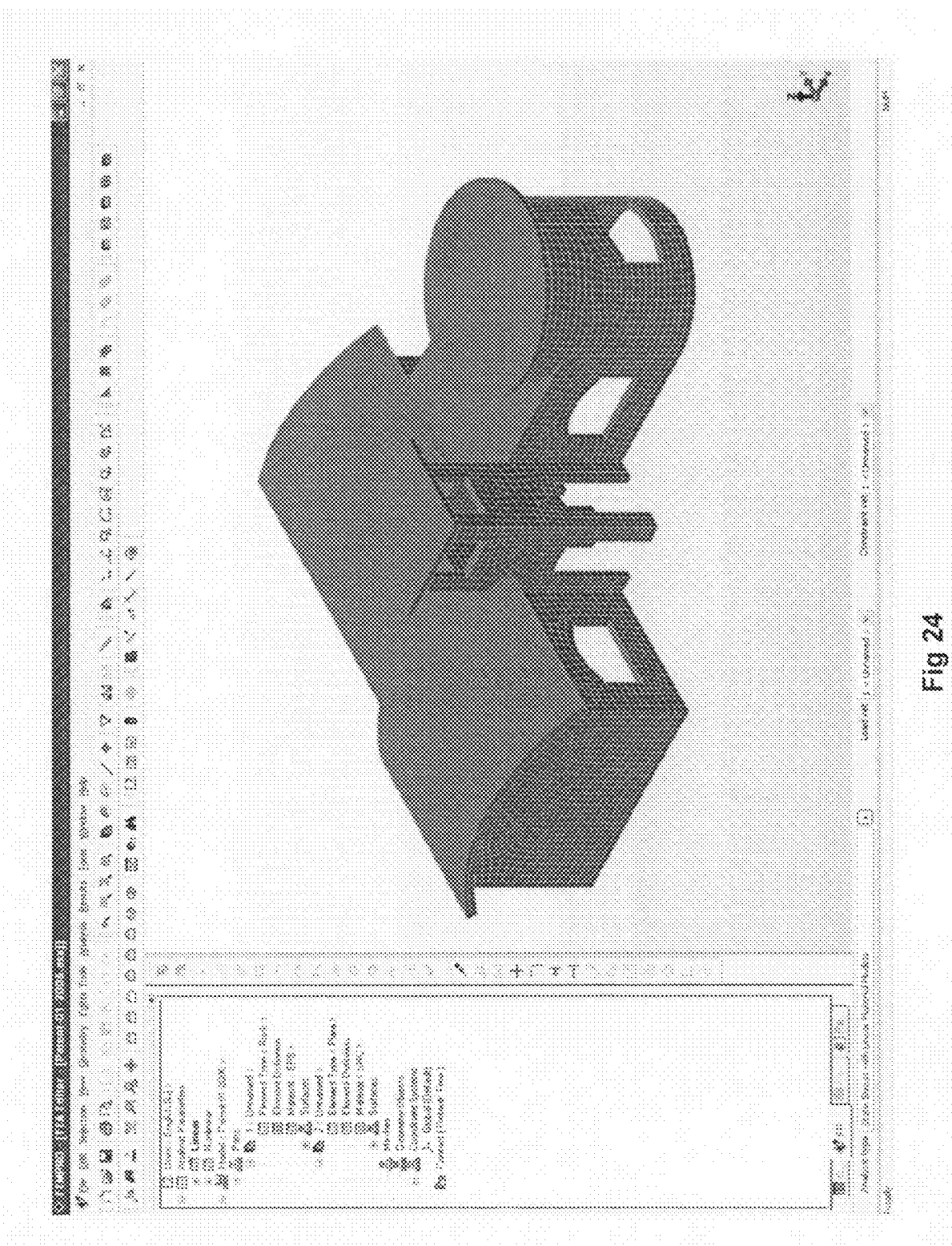

FIG. 24 shows that SRC has been selected as the Material for Part 2.

Figure 25:
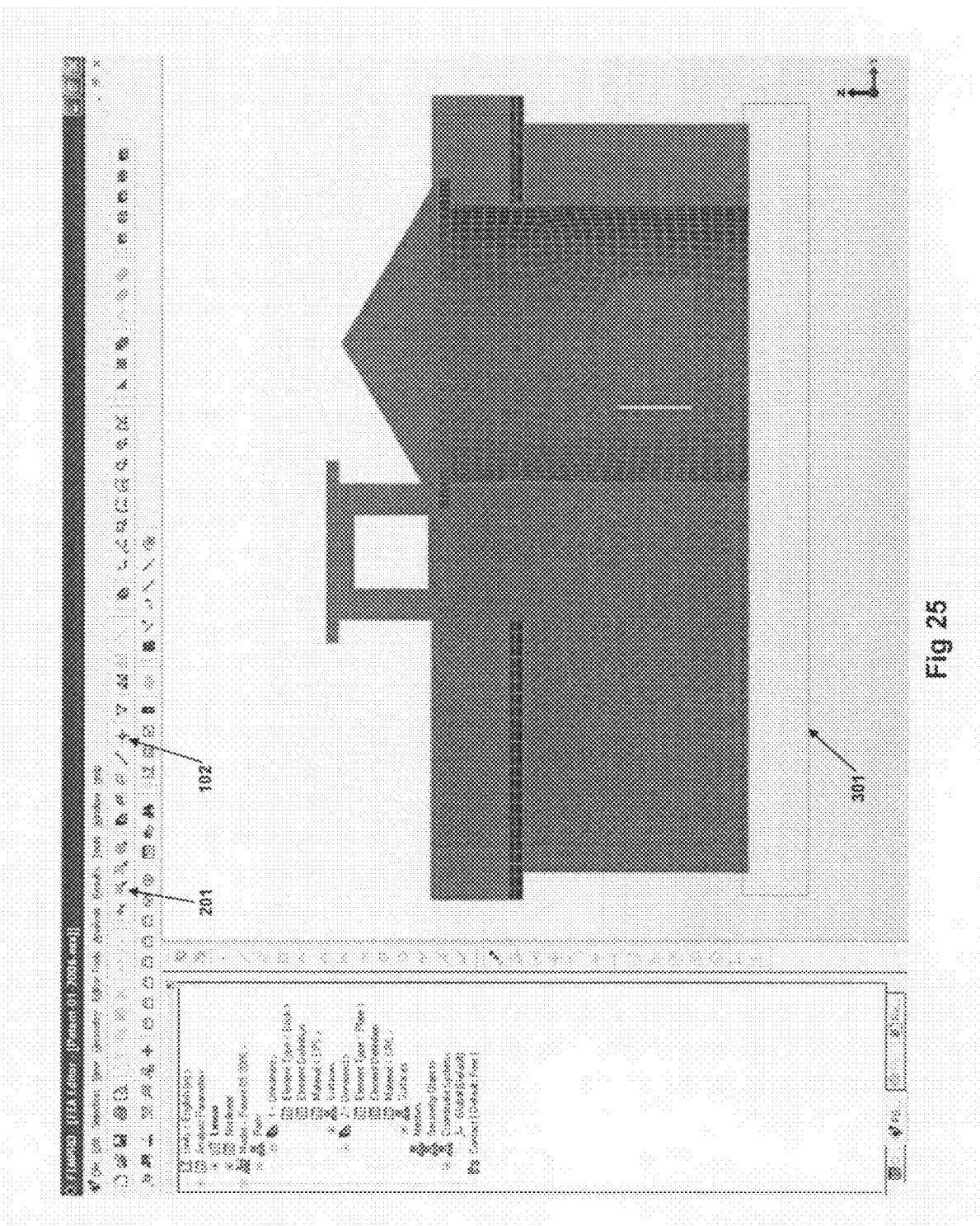

FIG. 25 shows the start of the setting of the boundary conditions. First, the tool icon 102 for nodes is clicked on.

Then, the tool icon 201 for selecting an area is clicked. Then, the bottom of the structure is selected by using the tool from icon 201 to create the area enclosed by line 301.

Figure 26:
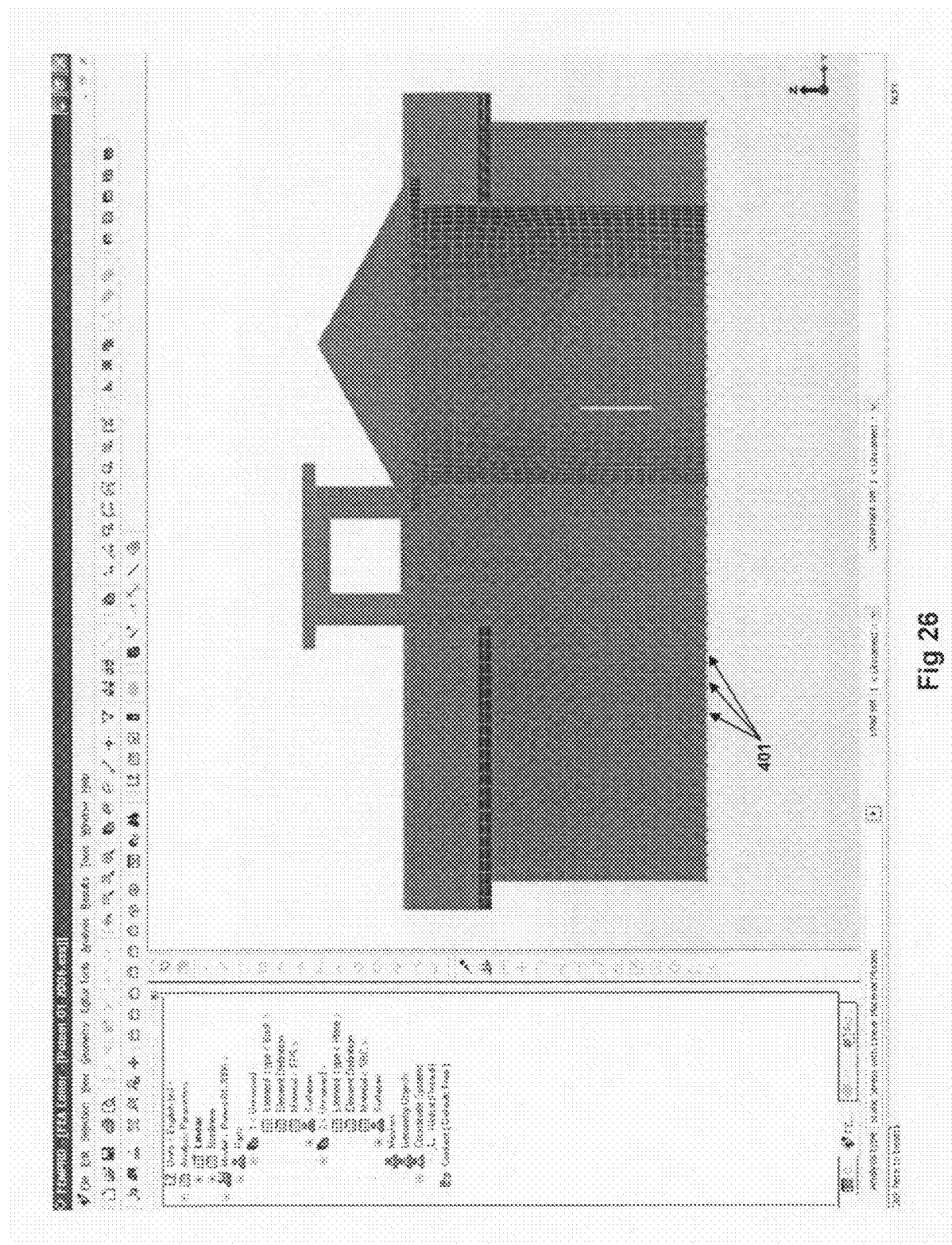

FIG. 26 shows the nodes 401 selected on the bottom of the building.

Figure 27:
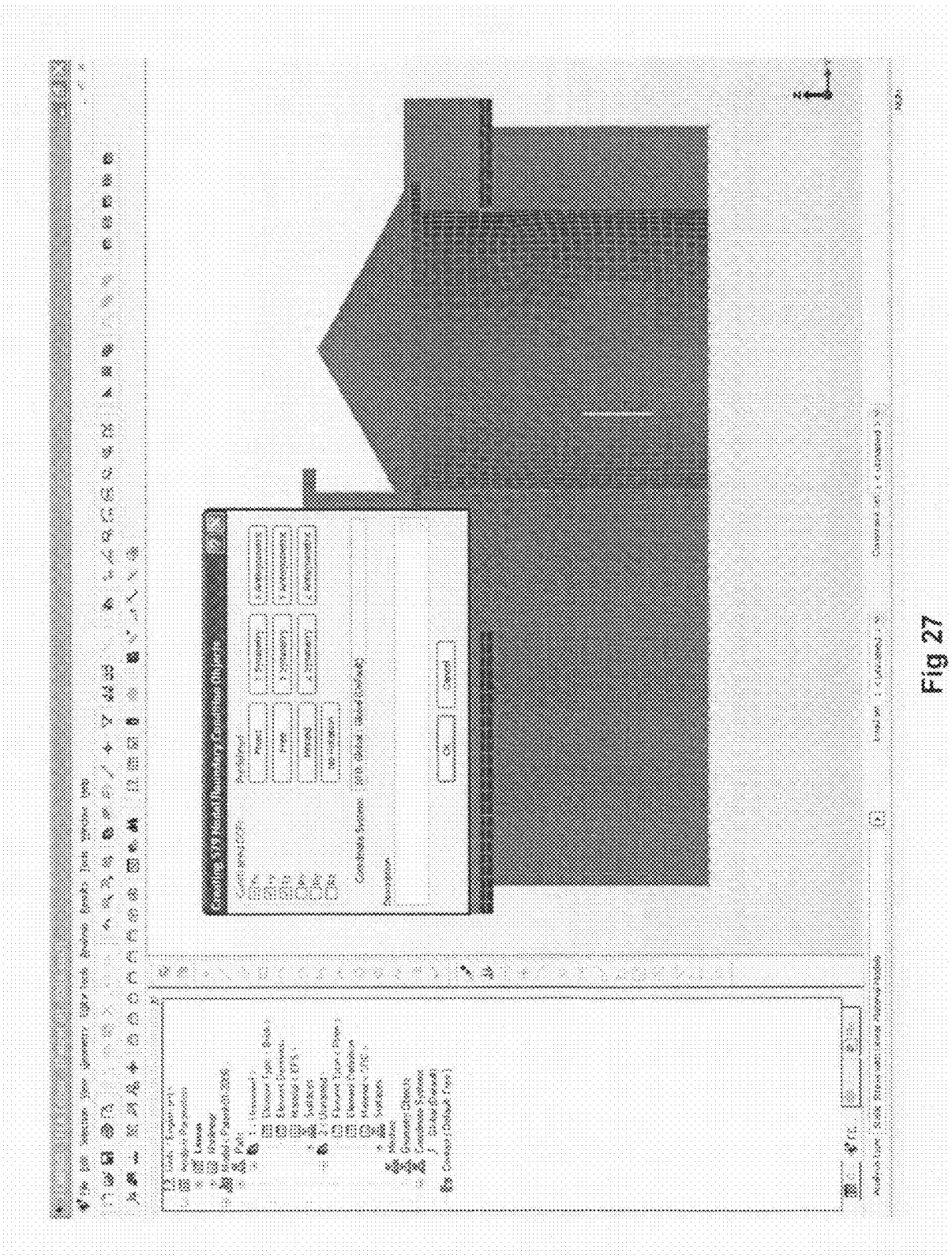

FIG. 27 shows the Creating 579 Nodal Boundary Condition Objects display. There are 579 nodes in the bottom or boundary of the structure. In this example, the Constrained DOFs (directions Of Freedom) are selected. They are Tx, Ty and Tz, that is, the nodes are constrained in translation about the x, y and z axes.

Figure 28:
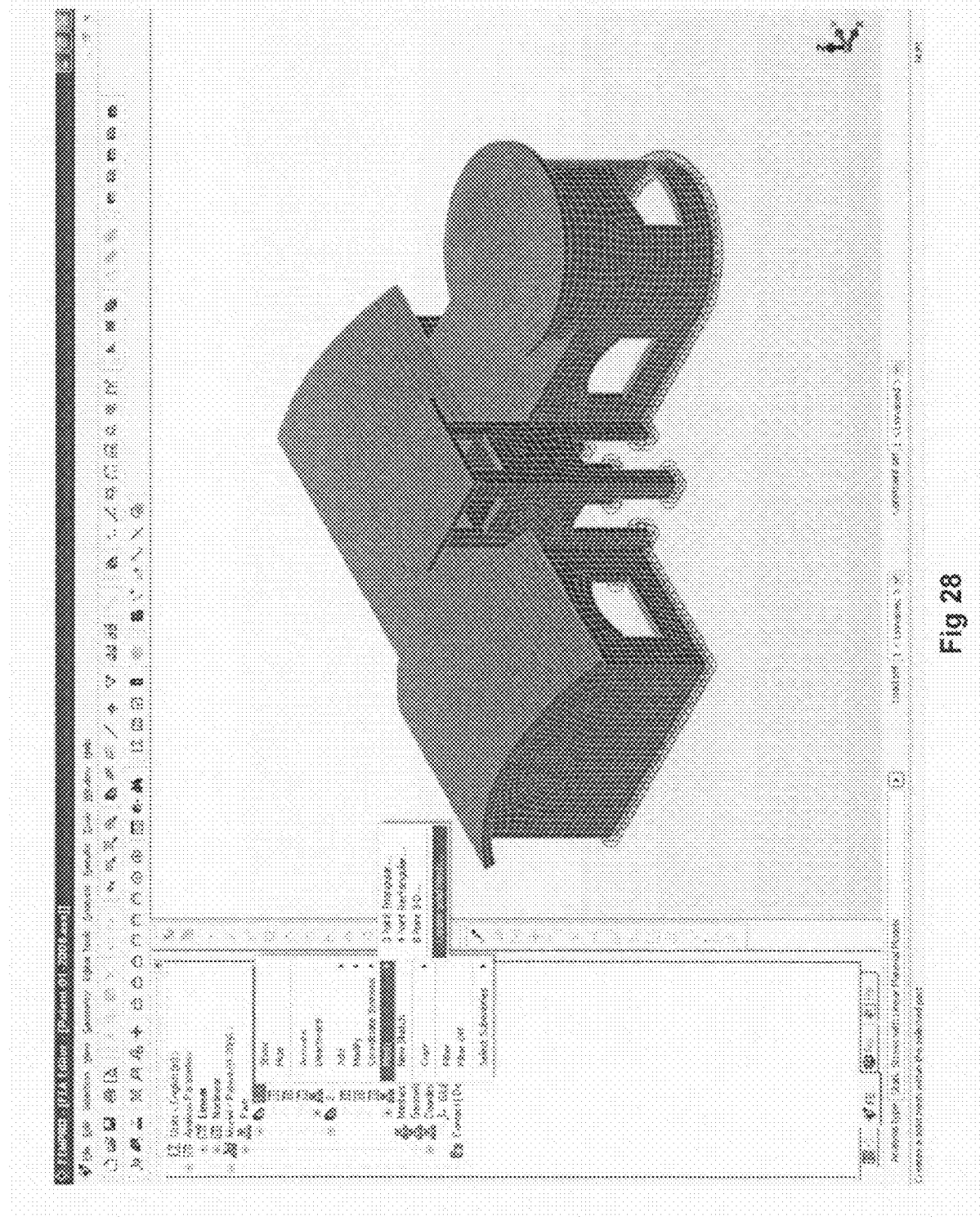

FIG. 28 shows the menu for creating Solid Mesh. To access the menu, click on Part 1 (the building) and right click. Then select Mesh and then select Solid Mesh which brings up the next display.

Figure 29:
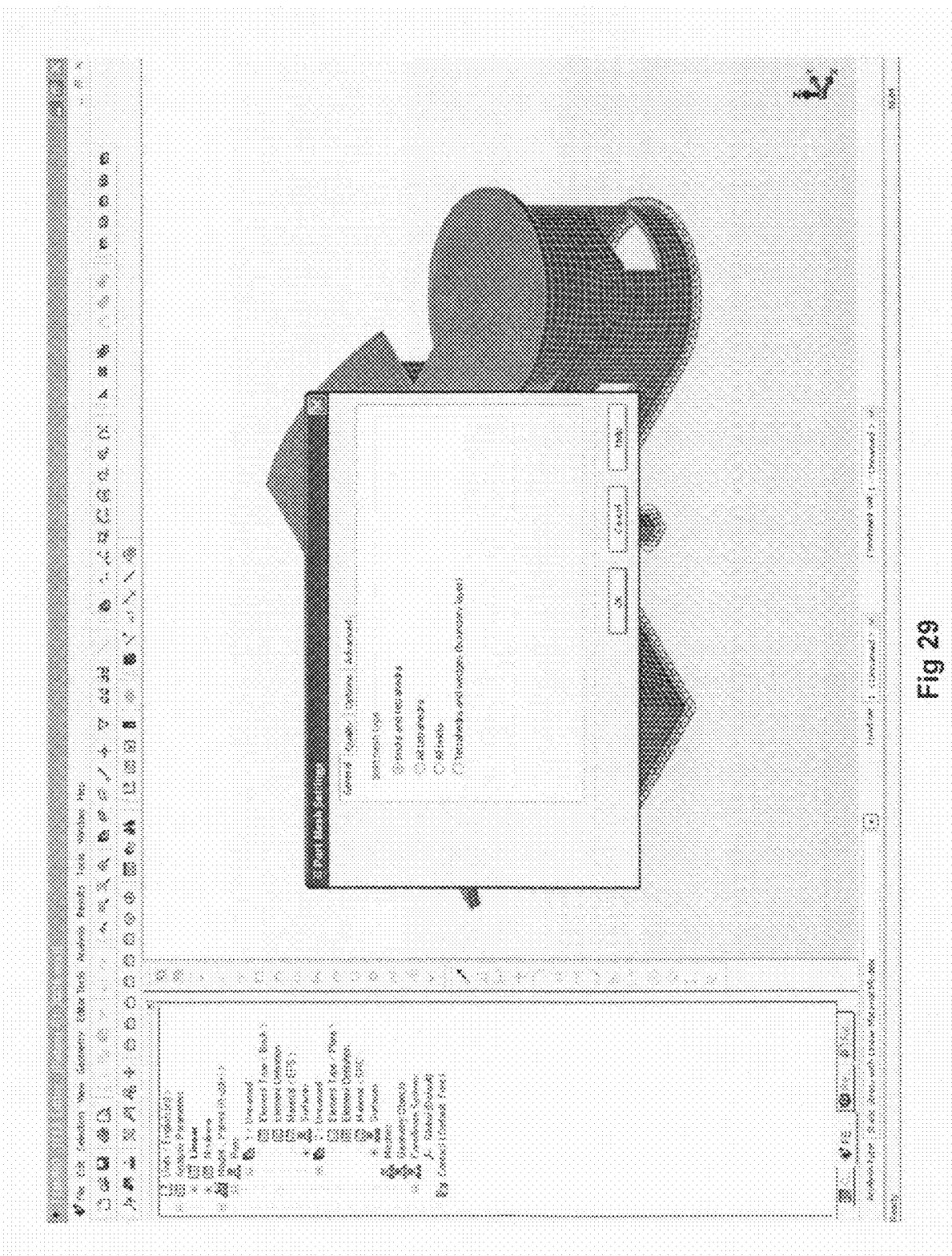

FIG. 29 shows the next display which is Part Mesh Settings. Bricks and tetrahedra are selected, and then OK is clicked to start Solid Meshing.

Figure 30:
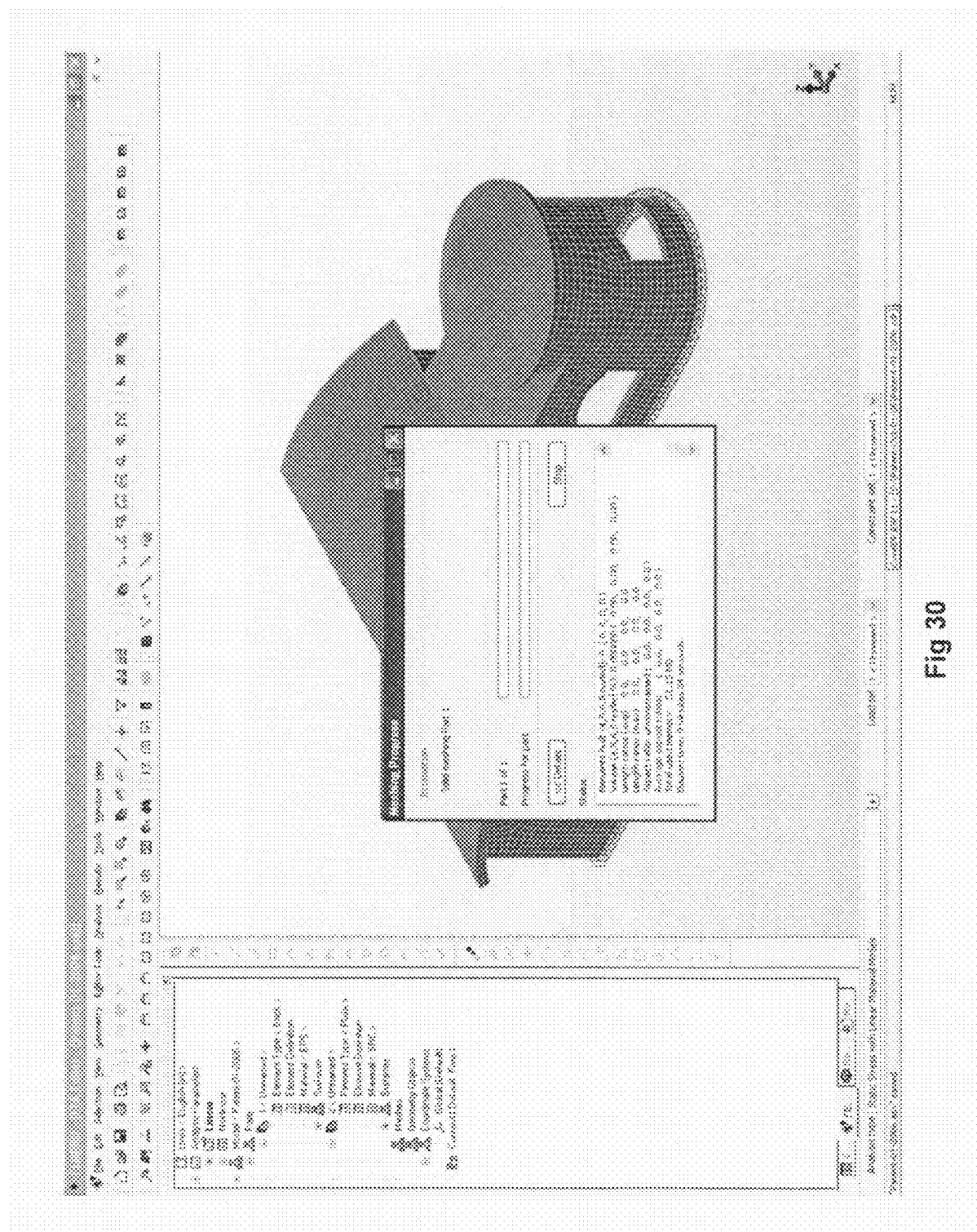

FIG. 30 shows the Meshing Progress display which comes up after OK is clicked.

Figure 31:
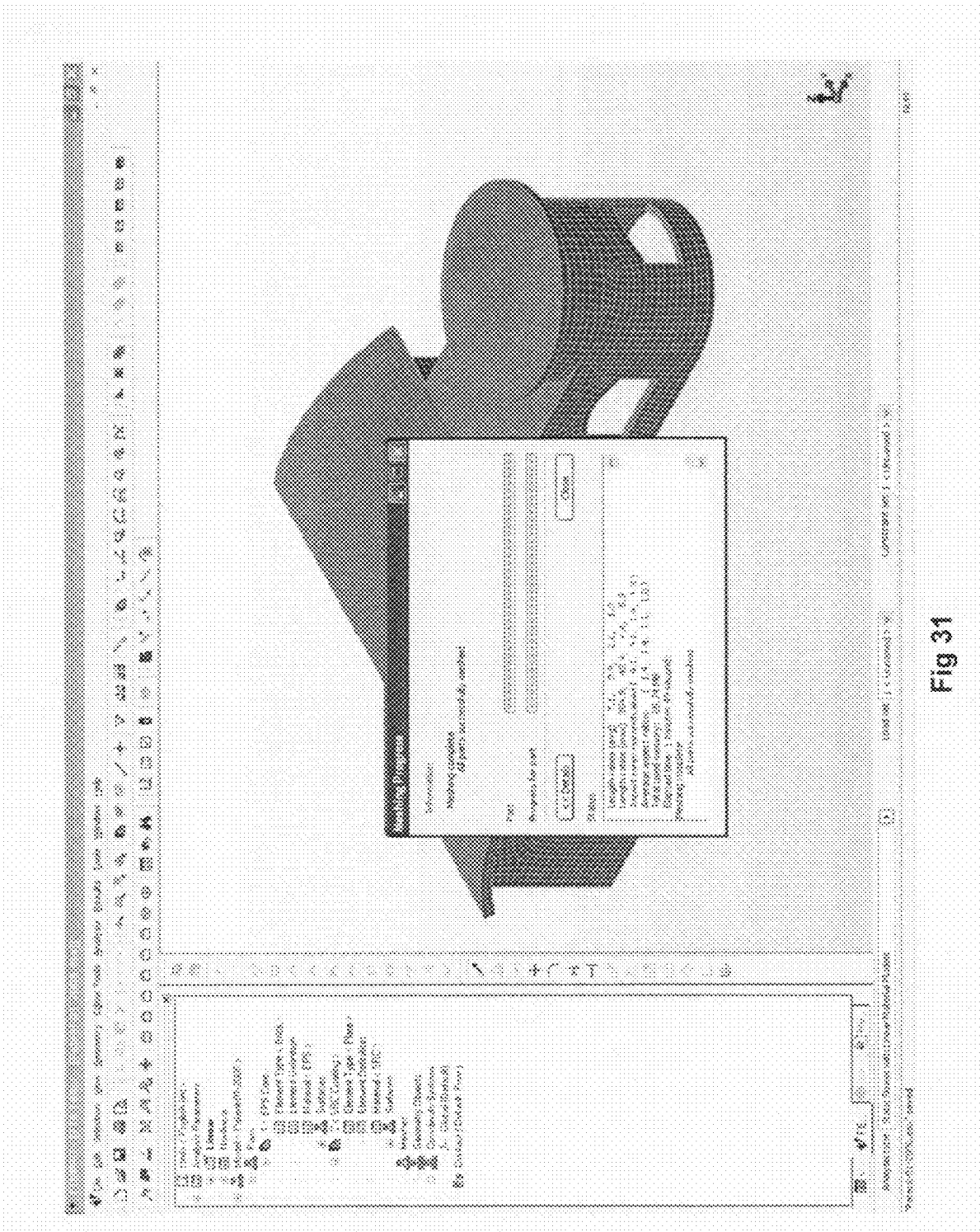

FIG. 31 shows Meshing Complete. The core of the building is now Bricks and Tetrahedrons. When Close is clicked, the next display comes up.

Figure 32:
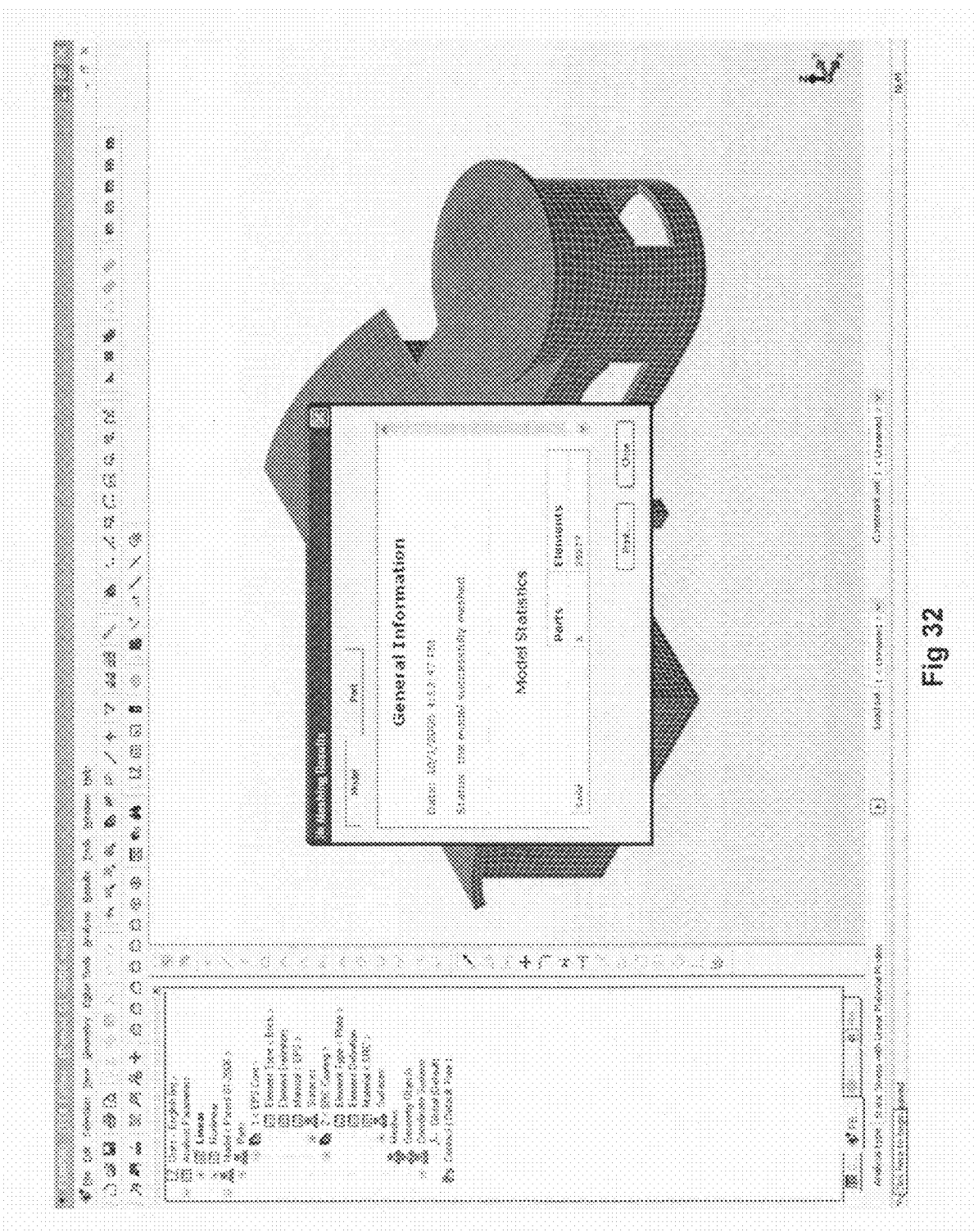

FIG. 32 shows the next display which is Meshing Results. This display gives information.

Figure 33:
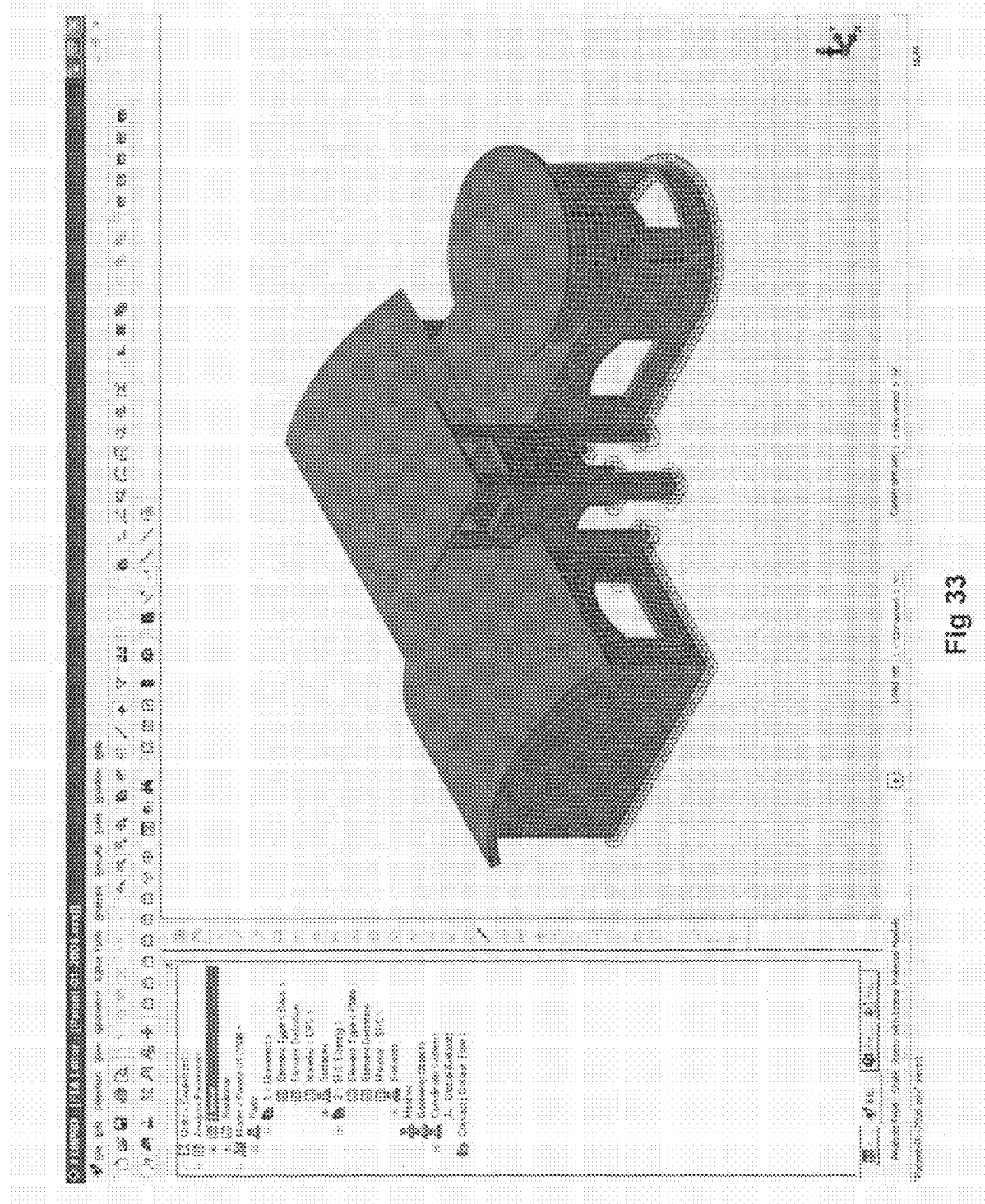

FIG. 33 shows the boundary nodes fixed and Linear analysis selected from the menu on the left middle of the display under Analysis Parameters.

Figure 34:
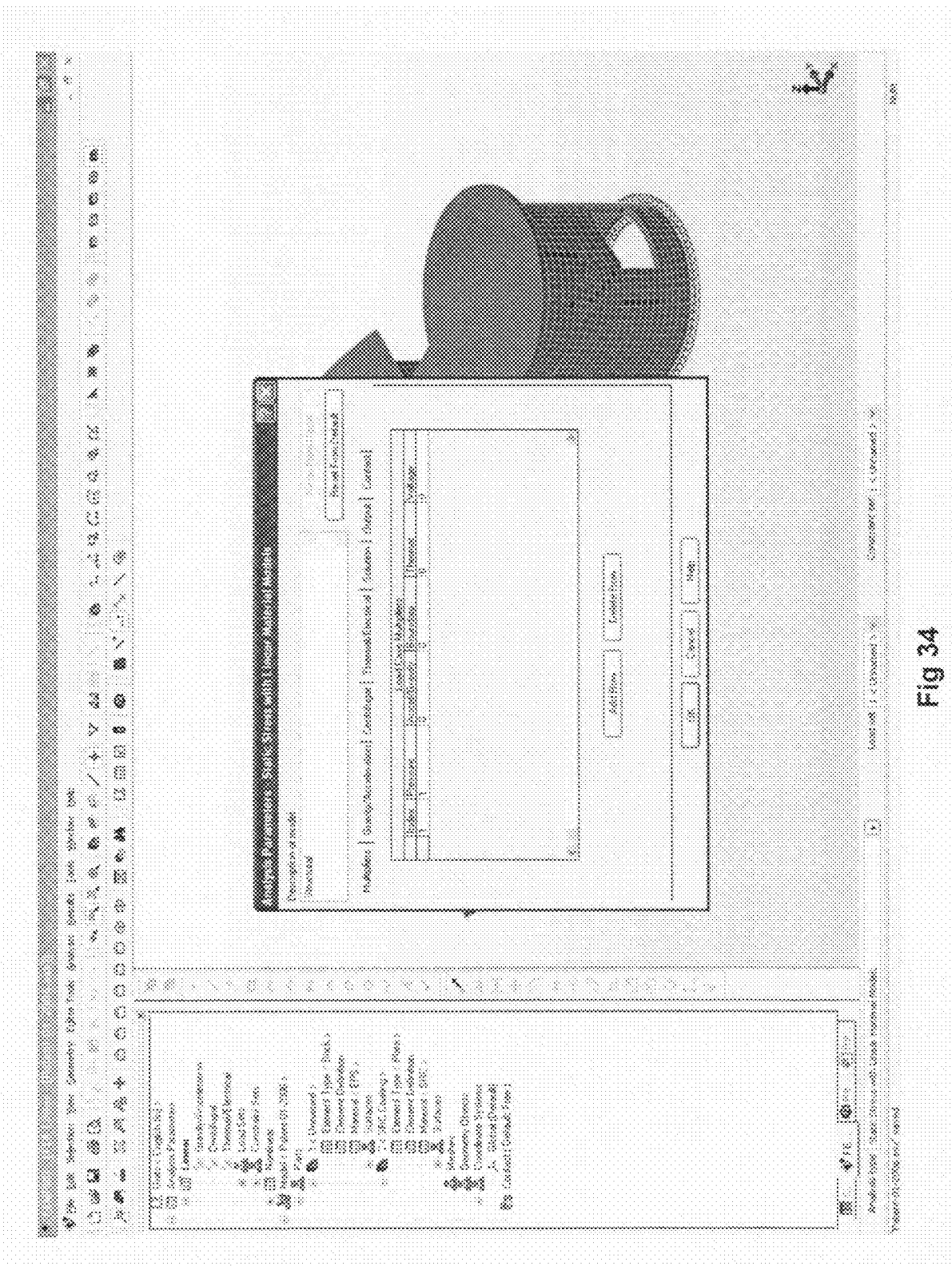

FIG. 34 shows the display Analysis Parameters—Static Stress with Linear Material Models. The Gravity/Acceleration tab is clicked which brings up the next display.

Figure 35:
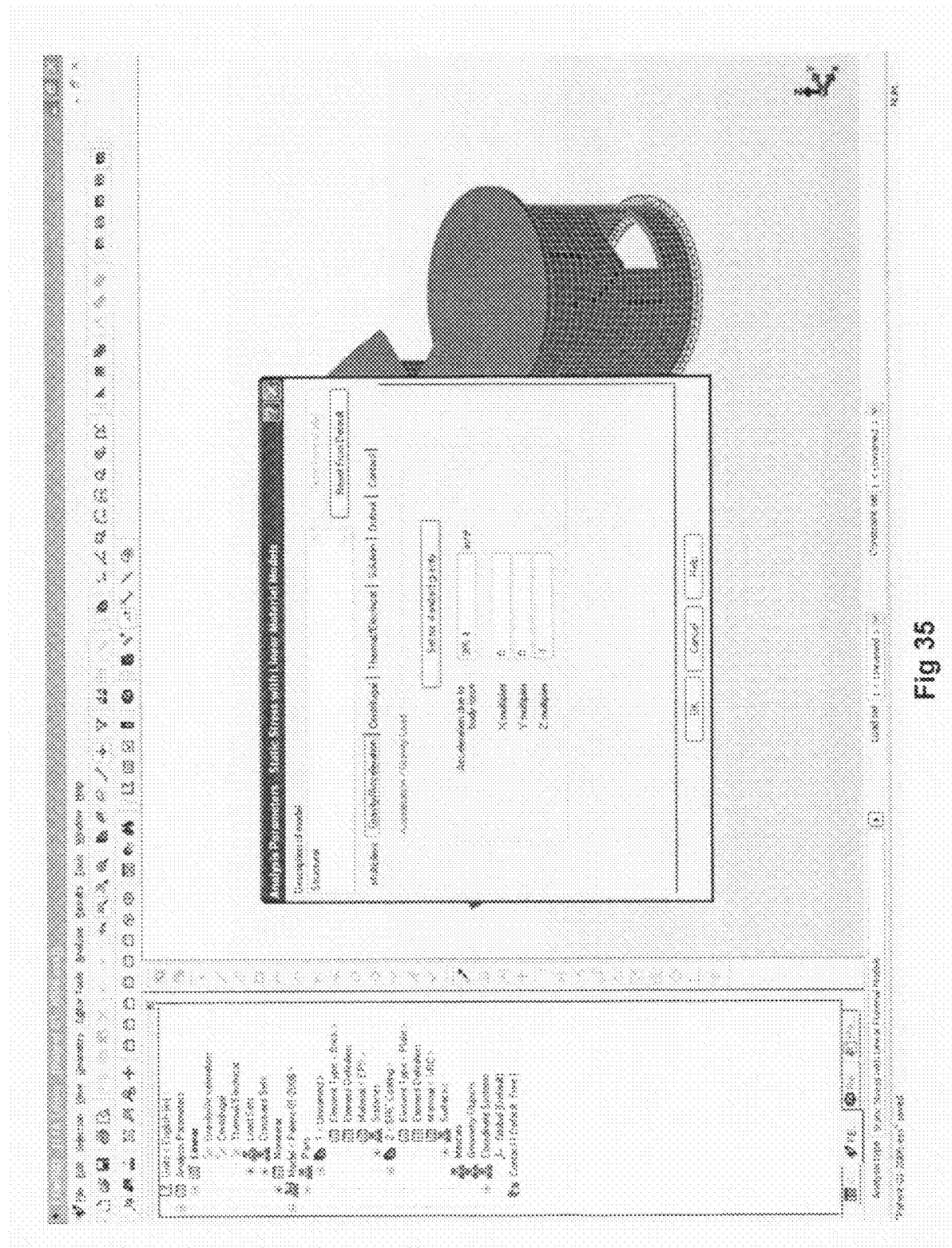

FIG. 35 shows the display for selecting Gravity/Acceleration. Standard gravity is selected, and OK is clicked.

Figure 36:
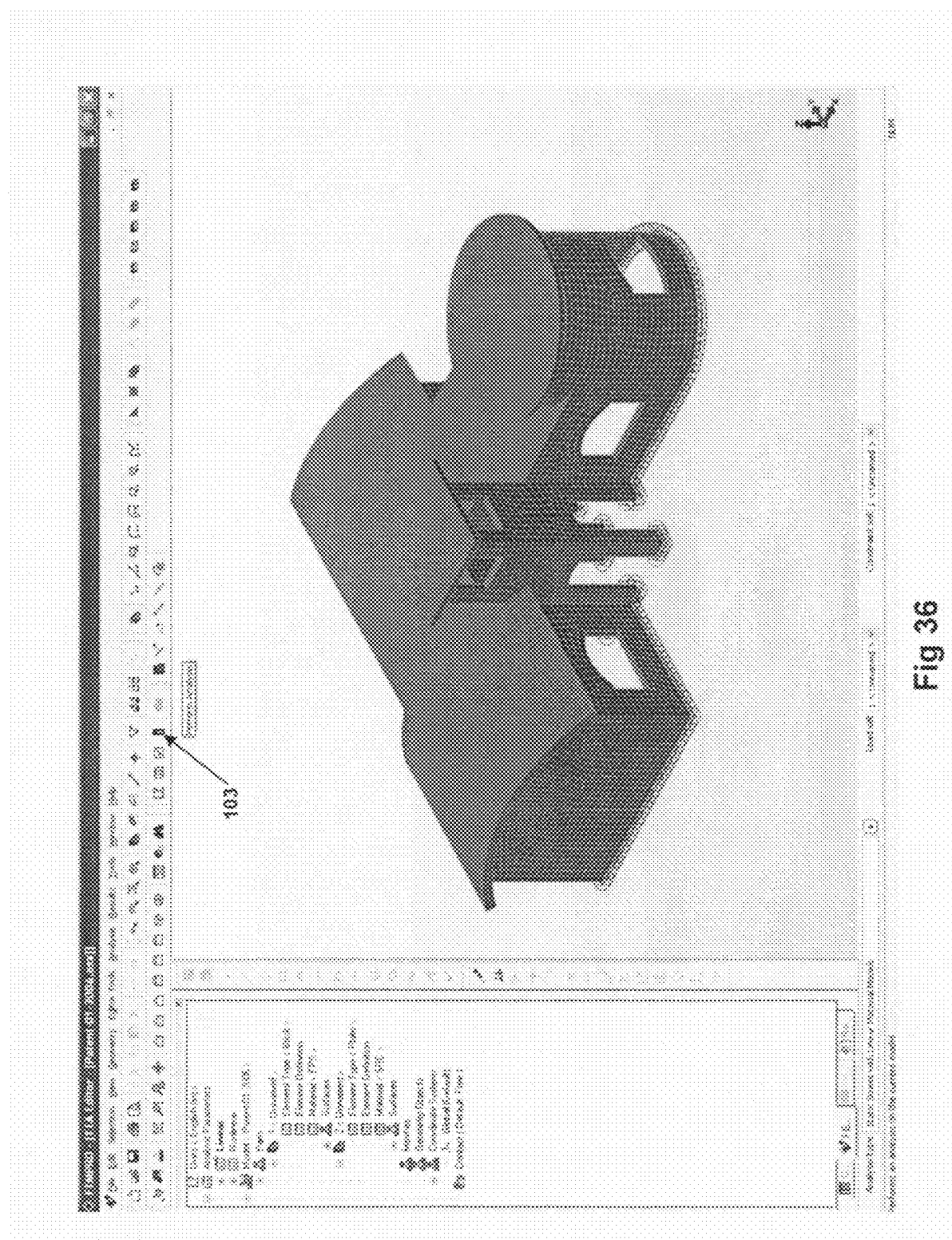

FIG. 36 shows tool icon 103—Perform Analysis. When Icon 103 is clicked, the Gravity analysis of the structure starts, and the next display comes up.

Figure 37:
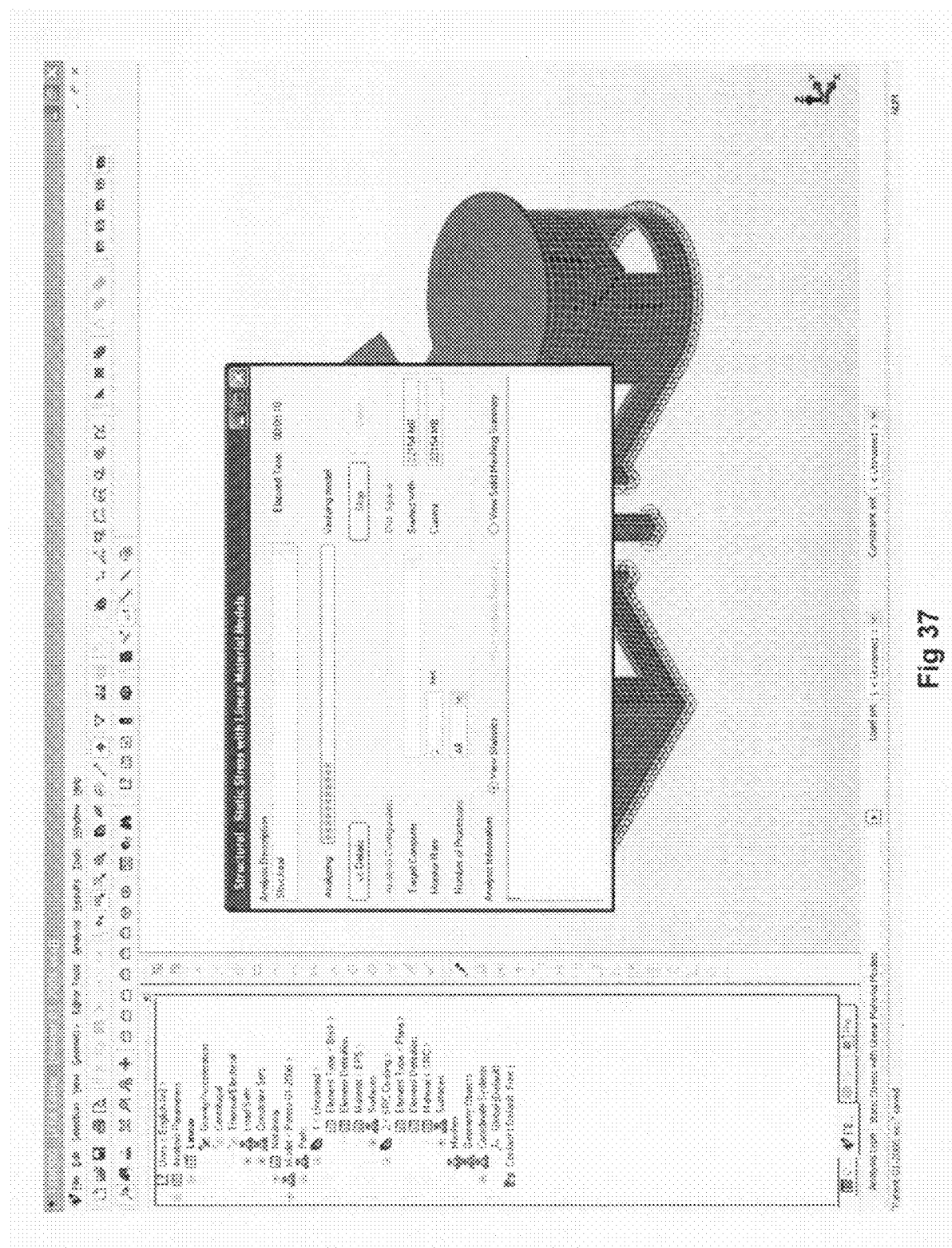

FIG. 37 shows the next display—Structural—Static Stress with linear Material Models. This display shows the analysis proceeding.

Figure 38:
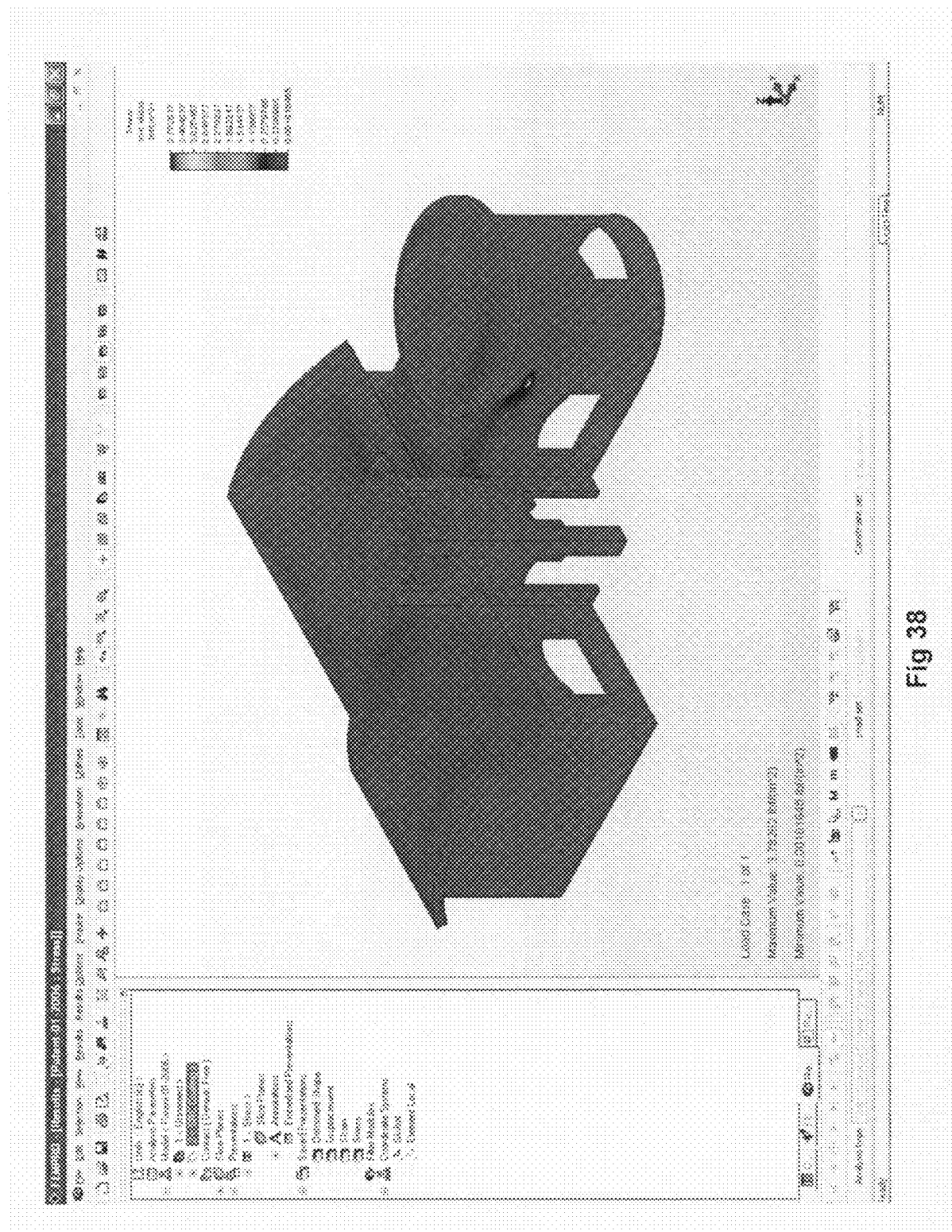

FIG. 38 shows the solution by the FEA program of the gravity loading in von Mises stress (pound feet per square inch) terms.

Figure 39:
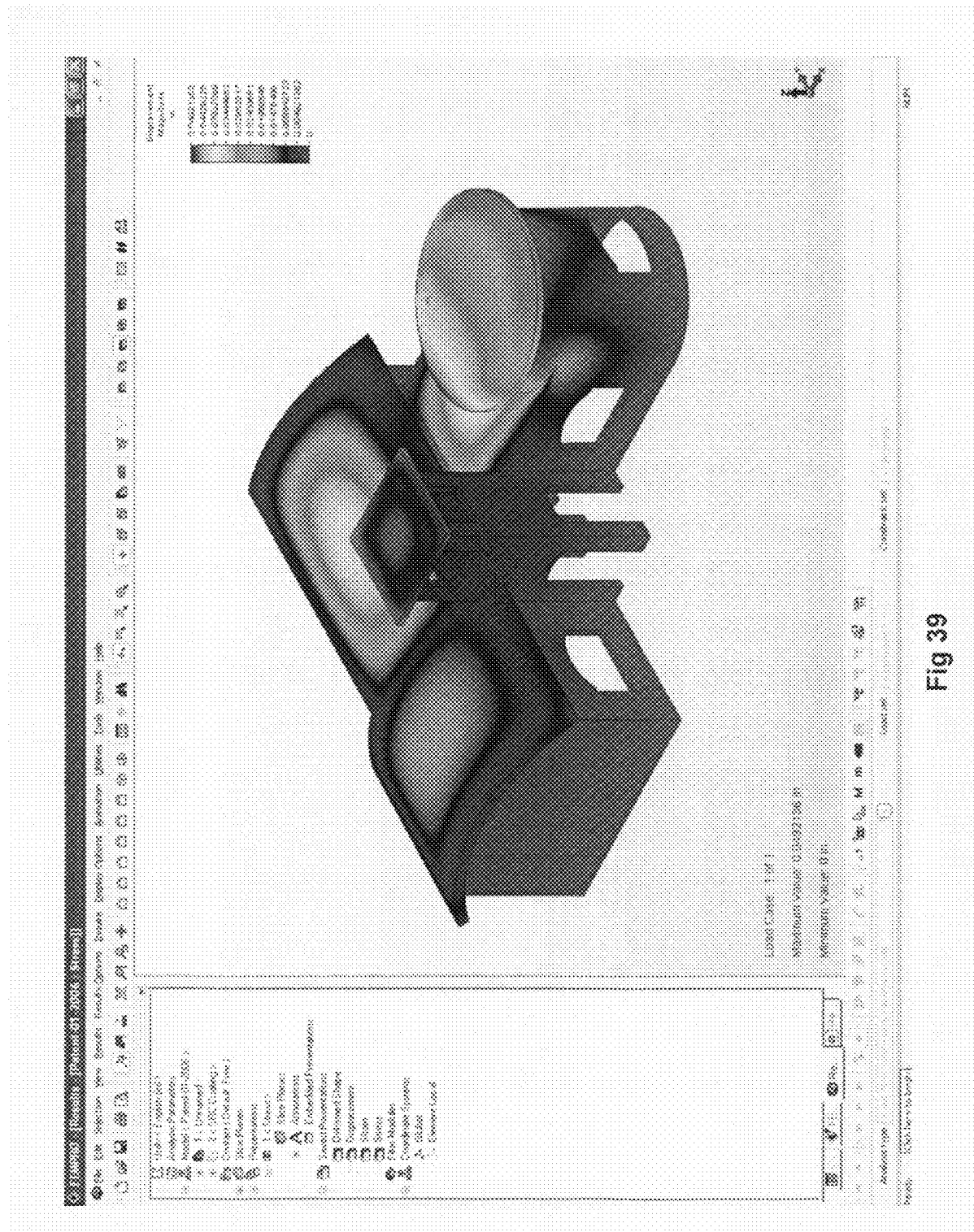

FIG. 39 shows the solution by the FEA program of the gravity loading in displacement (inch) terms.

Figure 40:
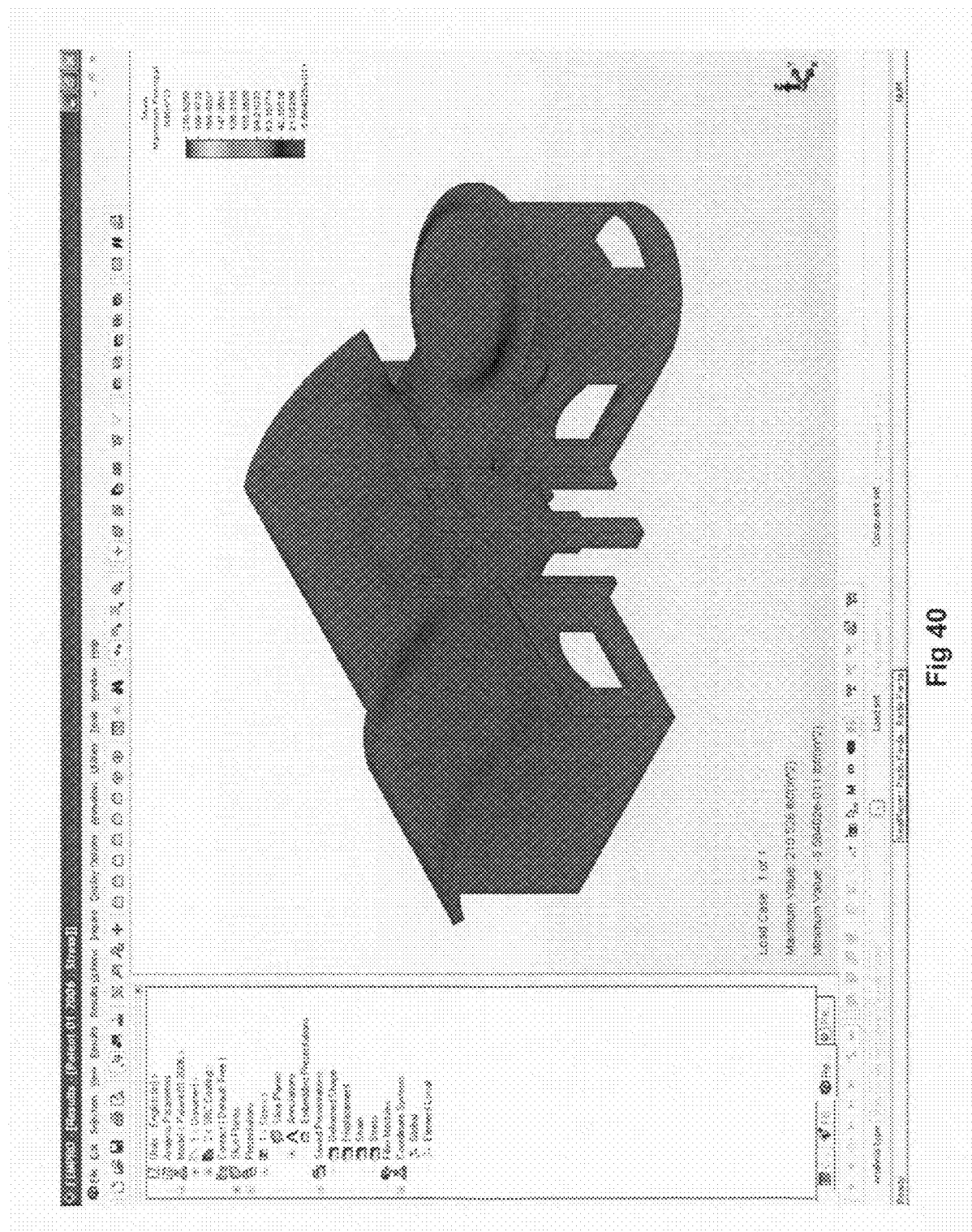

FIG. 40 shows the solution by the FEA program of the gravity loading in maximum principal stress (pound feet per square inch) terms.

The FEA program will provide messages if the CAD drawing or other portions of the file have problems. These problems can be corrected as per the instructions of the programs.

It may be necessary to break up the building into parts for various reasons, such as if the thickness or type of coating varies within in the structure, if additional coatings of different composition are added in certain areas, etc. In that situation, the same procedure could be followed for each part.

Various changes and modifications to the embodiments herein chosen for purposes of illustration will readily occur to those skilled in the art.

The strengthening coating on the plastic foam can be a Glass Fiber Reinforced Concrete (GFRC) or a Fiber Reinforced Polymer (FRP). The fibers can be plastic, glass, carbon, single-wall carbon nanotubes (SWNTs or Buckytubes), Aramid or other fibers. The Polymer can be Epoxies, Polyesters, Vinlyesters or other materials.

The coating also can be without fibers if the design loading is low enough. For the strongest structure, fibers should be added to the coating. The number of coats of the coating and the composition of those coats can be varied.

The type of plastic foam can be different from Expanded PolyStyrene (EPS). The EPS can have a density of 1.5 pounds per cu. ft. (nominal) which is actually 1.35 pounds per cu. ft. (actual). EPS was used because a Finite Element Analysis was done using EPS and GFRC. Suitable plastic foam could be PU, EPS, etc.

To the extent that such modifications and variations do not depart from the spirit of the invention, they are intended to be included within the scope thereof which is assessed only by a fair interpretation of the following claims.

I claim:

1. A method of analyzing a building constructed from a composite material, the composite material being formed from a plastic foam building core coated on both sides with a strengthening coating, the method comprising the following steps, creating a solid drawing of the building core in a computer assisted drawing (CAD) program, uniting the building core as one piece, creating a surface mesh on inner, outer and edge surfaces of the building to create a meshed drawing of the building by using an automeshing program in a CAD program or a CAD program in a Finite Element Analysis (FEA) program while treating the building as one piece, adding information about the building core, moving the meshed drawing of the building into an analysis portion of a FEA program, providing a plating of the strengthening coating on the inner, outer and edge surfaces of the building core by copying the inner, outer and edge surfaces mesh, the copying is performed at a zero distance from the surface mesh, assigning properties of the strengthening coating to the plating on the inner, outer and edge surfaces of the building, the meshed building having boundary nodes, defining a boundary condition for the boundary nodes solid meshing the building core in the FEA program, and using the FEA program to an run analysis of the effect of a loading on the building.

2. The method of claim 1 including the step of, running an analysis of static loads to be designed for.

3. The method of claim 1 including the step of, running an analysis of dynamic loads to be designed for.

4. The method of claim 1 including the step of, running an analysis of the thermal loads to be designed for.

* * * * *